(12) United States Patent
Kim et al.

(10) Patent No.: US 12,193,251 B2
(45) Date of Patent: Jan. 7, 2025

(54) QUANTUM DOT COMPOSITION, METHOD OF MANUFACTURING DISPLAY DEVICE INCLUDING THE SAME, AND DISPLAY DEVICE MANUFACTURED BY THE DISPLAY DEVICE MANUFACTURING METHOD

(71) Applicant: Samsung Display Co., Ltd, Yongin-si (KR)

(72) Inventors: Soodong Kim, Hwaseong-si (KR); Woo-Man Ji, Anyang-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 415 days.

(21) Appl. No.: 17/741,373

(22) Filed: May 10, 2022

(65) Prior Publication Data

US 2023/0050437 A1 Feb. 16, 2023

(30) Foreign Application Priority Data

Aug. 12, 2021 (KR) ........................ 10-2021-0106422

(51) Int. Cl.
| | | |
|---|---|---|
| H10K 50/115 | (2023.01) | |
| B82Y 15/00 | (2011.01) | |
| B82Y 30/00 | (2011.01) | |
| H10K 85/10 | (2023.01) | |
| H10K 102/00 | (2023.01) | |

(52) U.S. Cl.
CPC .......... *H10K 50/115* (2023.02); *H10K 85/10* (2023.02); *B82Y 15/00* (2013.01); *B82Y 30/00* (2013.01); *H10K 2102/00* (2023.02)

(58) Field of Classification Search
CPC .. H10K 50/115; H10K 85/10; H10K 2102/00; H10K 59/12; H10K 59/8792; H10K 59/877; H10K 2102/331; H10K 59/38; H10K 71/00; H10K 71/12; B82Y 15/00; B82Y 30/00; B82Y 20/00; G02B 5/201; G02B 5/206; C09K 11/02; C09K 11/025; C09K 2211/18

See application file for complete search history.

(56) References Cited

U.S. PATENT DOCUMENTS

| | | | |
|---|---|---|---|
| 10,185,066 B2 * | 1/2019 | Chae | H10K 59/38 |
| 12,068,441 B2 * | 8/2024 | Takiguchi | H01L 33/005 |
| 2018/0164640 A1 * | 6/2018 | Kim | G02F 1/133504 |
| 2019/0086733 A1 * | 3/2019 | Min | G02B 6/0011 |
| 2021/0382352 A1 * | 12/2021 | Kim | G02B 1/10 |

FOREIGN PATENT DOCUMENTS

| | | |
|---|---|---|
| KR | 10-2018-0018945 | 2/2018 |
| KR | 10-2018-0109238 | 10/2018 |

* cited by examiner

*Primary Examiner* — Douglas W Owens
(74) *Attorney, Agent, or Firm* — KILE PARK REED & HOUTTEMAN PLLC

(57) ABSTRACT

A quantum dot composition includes a scatterer containing an inorganic material, a quantum dot containing a core and a shell surrounding the core, a ligand binding to the quantum dot, a polymer resin in which the quantum dot and the scatterer are dispersed, and a dispersant containing at least one of an acidic substituent or a basic substituent. At least one of the polymer resin or the dispersant includes a same material as the shell and the ligand binds to the polymer resin or dispersant that includes the same material as a shell.

20 Claims, 17 Drawing Sheets

QUANTUM DOT COMPOSITION, METHOD OF MANUFACTURING DISPLAY DEVICE INCLUDING THE SAME, AND DISPLAY DEVICE MANUFACTURED BY THE DISPLAY DEVICE MANUFACTURING METHOD

CROSS-REFERENCE TO RELATED APPLICATIONS

This application claims priority from and the benefit of Korean Patent Application No. 10-2021-0106422, filed on Aug. 12, 2021, which is hereby incorporated by reference for all purposes as if fully set forth herein.

BACKGROUND

Field

Embodiments of the invention relate generally to a quantum dot composition, a display device manufacturing method including providing the quantum dot composition, and a display device manufactured by the display device manufacturing method.

Discussion of the Background

Various types of display devices are being developed that are used in multimedia devices, such as a television, a mobile phone, a tablet computer, a navigation system, and a game console. In these display devices, a so-called self-luminous display element is being used, which creates a display of an image by causing an organic compound-containing luminescent material to emit light.

A display device includes a light control layer for improving the color reproducibility, and the light control layer may be formed from a solution including a quantum dot. The quantum dot is provided by binding ligands, and the ligands may affect the efficiency of the display device.

The above information disclosed in this Background section is only for understanding of the background of the inventive concepts, and, therefore, it may contain information that does not constitute prior art.

SUMMARY

Inventive concepts consistent with one or more embodiments of the invention provide a quantum dot composition with minimized efficiency changes due to ligands, and a display device manufacturing method including providing the quantum dot composition.

Inventive concepts consistent with one or more embodiments also provide a display device with stabilized efficiency.

Additional features of the inventive concepts will be set forth in the description that follows, and in part will be apparent from the description, or may be learned by practice of the inventive concepts.

An embodiment provides a quantum dot composition that comprises a scatterer that includes an inorganic material; a quantum dot that includes a core and a shell surrounding the core; a ligand binding to the quantum dot; a polymer resin in which the quantum dot and the scatterer are dispersed; and a dispersant that includes at least one of an acidic substituent or a basic substituent, wherein at least one of the polymer resin or the dispersant includes a same material as the shell.

In an embodiment, the dispersant may include the same material as the shell, and the ligand may be detached from the quantum dot due to at least one of heat or light to bind to the dispersant.

In an embodiment, the polymer resin may include the same material as the shell, and the ligand may be detached from the quantum dot due to at least one of heat or light to bind to the polymer resin.

In an embodiment, the quantum dot composition may further include an inorganic particle containing the same material as the shell and dispersed in the polymer resin, and the ligand may be detached from the quantum dot due to at least one of heat or light to bind to the inorganic particle.

In an embodiment, the quantum dot composition may further include a sub dispersant that disperses the inorganic particle.

In an embodiment, the polymer resin may include an acrylate-based compound, a diacrylate-based compound, or a methacrylate-based compound.

In an embodiment, the polymer resin may have a vapor pressure of $10^{-3}$ mmHg or less.

In an embodiment, the shell may include at least one of $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, $MgAl_2O_4$, $CoFe_2O_4$, $NiFe_2O_4$, $CoMn_2O_4$, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb.

In an embodiment, provided is a display device manufacturing method comprising forming a light control layer, the forming of the light control layer including: forming a plurality of partition walls spaced apart from each other; and forming a light control part by providing a quantum dot composition between the partition walls, wherein the quantum dot composition includes a scatterer containing an inorganic material, a quantum dot containing a core and a shell surrounding the core, a ligand binding to the quantum dot, a polymer resin in which the quantum dot and the scatterer are dispersed, and a dispersant containing at least one of an acidic substituent or a basic substituent, at least one of the polymer resin, the dispersant, or the partition walls including a same material as the shell.

In an embodiment, the forming of the light control part may include supplying at least one of heat or light to the quantum dot composition, and the ligand may be detached from the quantum dot due to at least one of the heat or the light to bind to at least one of the polymer resin, the dispersant, or the partition walls.

In an embodiment, the method may further include, before the forming of the light control part, forming a cover layer that includes the same material as the shell and covers side surfaces of the partition walls.

In an embodiment, the method may further include, before or after the forming of the light control layer, forming a coating layer that includes the same material as the shell and is disposed on one surface of the light control layer.

In an embodiment, the method may further include, before the forming of the coating layer, polishing the one surface of the light control layer.

In an embodiment, a display device includes: a display element layer; a color filter layer disposed on the display element layer; and a light control layer disposed between the display element layer and the color filter layer, the light control layer that includes a plurality of partition walls spaced apart from each other, and a light control part disposed between the partition walls, the light control part that includes a quantum dot containing a core and a shell surrounding the core, a scatterer containing an inorganic material, a polymer resin in which the quantum dot and the scatterer are dispersed, a dispersant containing at least one of an acidic substituent or a basic substituent, and a plurality of ligands binding to the surface of the shell or detached from the surface of the shell, wherein at least one of the polymer resin, the dispersant, or the partition walls includes a same material as the shell, and at least one of the ligands binds to the polymer resin, dispersant, or partition walls including the same material as the shell.

In an embodiment, the light control part may further include an inorganic particle containing the same material as the shell and dispersed in the polymer resin, and at least one of the ligands may bind to the inorganic particle.

In an embodiment, the light control layer may further include a cover layer that includes the same material as the shell and covers side surfaces of the partition walls adjacent to the light control parts, and at least one of the ligands may bind to the cover layer.

In an embodiment, the light control layer may further include a sub cover layer that includes the same material as the shell and covers one surface of the light control parts adjacent to the display element layer, and at least one of the ligands may bind to the sub cover layer.

In an embodiment, the sub cover layer may non-overlap the partition walls.

In an embodiment, the display device may further include a coating layer that includes the same material as the shell and is disposed on an upper surface or a lower surface of the light control layer, and at least one of the ligands may bind to the coating layer.

In an embodiment, the partition walls may include an inorganic particle formed of the same material as the shell, or the partition walls may include a compound formed of the same material as the shell, and at least one of the ligands may bind to the inorganic particle or the compound.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
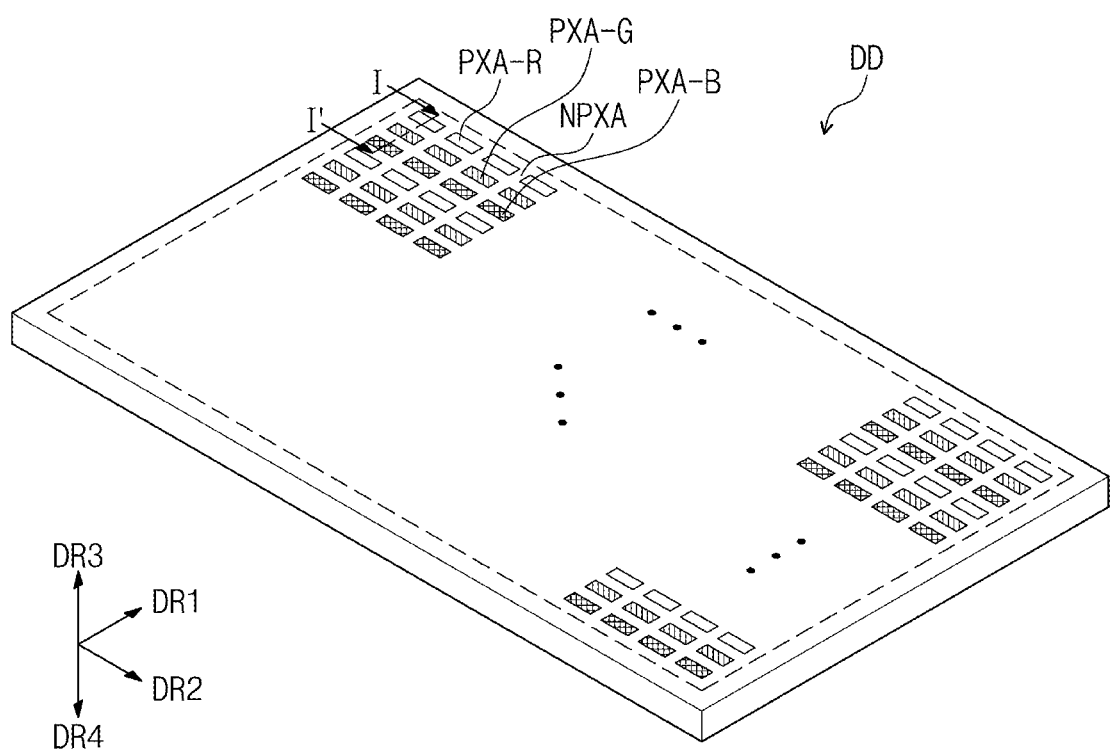
FIG. 1 is a perspective view illustrating a display device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the inventive concept will be described in detail with reference to the accompanying drawings. FIG. 1 is a perspective view illustrating a display device according to an embodiment that is constructed according to principles of the invention, and FIG. 2 is a cross-sectional view illustrating a part taken along line I-I' of FIG. 1.

A display device DD according to an embodiment may be a device to be activated in response to an electrical signal. For example, the display device DD may be a television, a monitor, an outdoor billboard, a mobile phone, a tablet computer, a vehicle navigation system, a game console, or a wearable device, but an embodiment consistent with one or more of the inventive concepts is not limited thereto.

The thickness direction of the display device DD may be a direction-parallel to a third direction axis DR3 that is a normal direction of a plane defined by a first direction axis DR1 and a second direction axis DR2. A fourth direction axis DR4 may be a direction that is parallel to a normal direction of a plane defined by the first direction axis DR1 and the second direction axis DR2, and the fourth direction axis DR4 may be opposite to the third direction axis DR3. The directions indicated by the first to fourth direction axes DR1, DR2, DR3 and DR4 used in this specification are relative concepts and may thus be changed into other directions. In addition, the directions indicated by the first to fourth direction axes DR1, DR2, DR3 and DR4 may be explained as first to fourth directions, and the same reference numerals or symbols may be used therefor. In this specification, the first direction axis DR1 and the second direction axis DR2 are perpendicular to each other, and the third direction axis DR3 and the fourth direction axis DR4 may be a normal direction of a plane defined by the first direction axis DR1 and the second direction axis DR2. Alternatively, these axes may be substantially perpendicular to each other in other implementations of the embodiments described herein.

Figure 2:
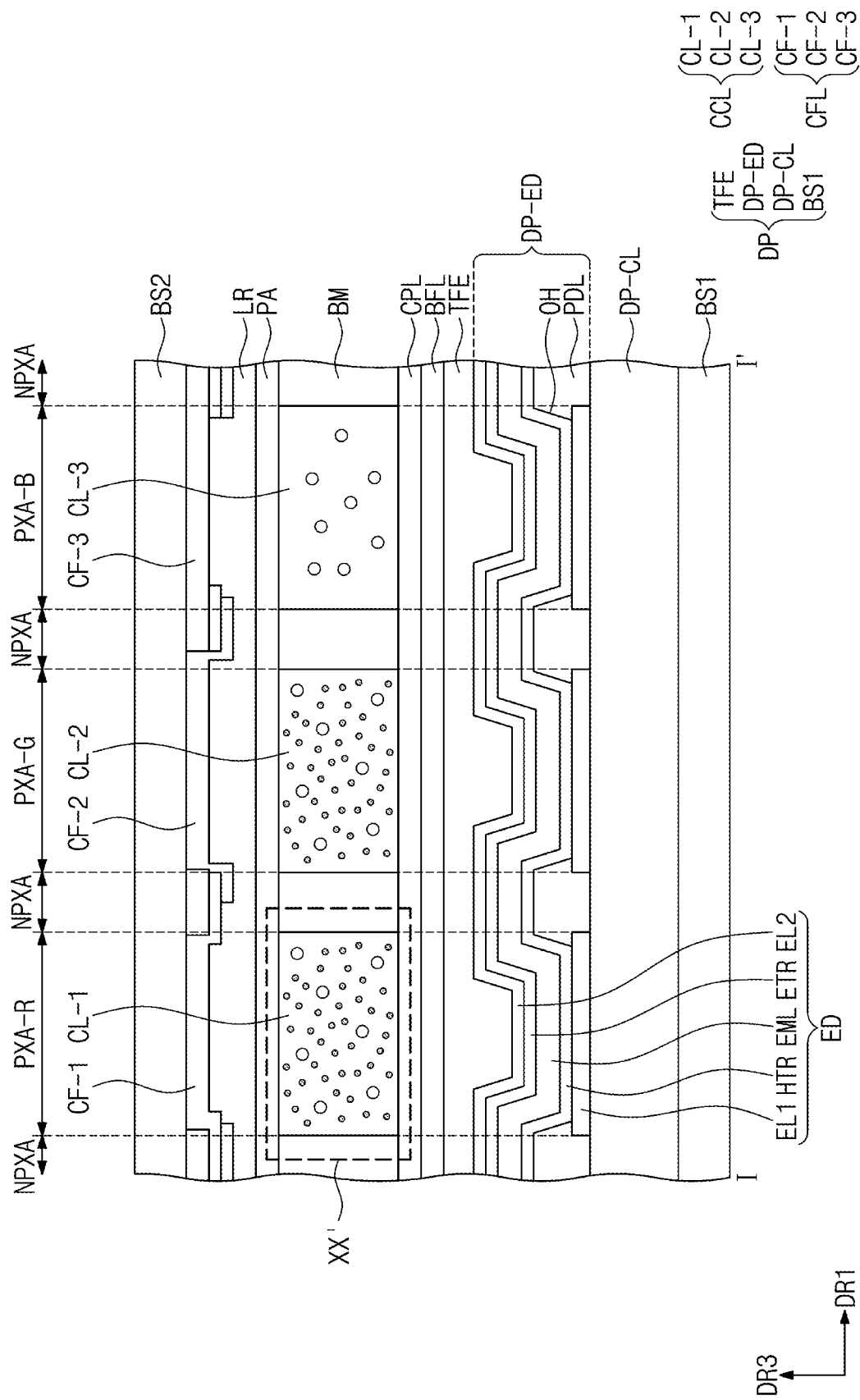
FIG. 2 is a cross-sectional view taken along line I-I' illustrated in FIG. 1.

Referring to FIGS. 1 and 2, the display device DD may include a non-light emitting region NPXA and light-emitting regions PXA-R, PXA-G and PXA-B. The light-emitting regions PXA-R, PXA-G and PXA-B may be spaced apart from each other on a plane. Each of the light-emitting regions PXA-R, PXA-G and PXA-B may be a region in which light generated from a light-emitting element ED is emitted.

The respective light-emitting regions PXA-R, PXA-G and PXA-B may be separated by pixel definition films PDL. The non-light emitting regions NPXA may be regions between neighboring light-emitting regions PXA-R, PXA-G and PXA-B and may be regions corresponding to the pixel definition films PDL.

The light-emitting regions PXA-R, PXA-G and PXA-B may be divided into a plurality of groups according to colors of light generated from light-emitting elements ED. In the display device DD according to an embodiment illustrated in FIGS. 1 and 2, three light-emitting regions PXA-R, PXA-G and PXA-B, in which red light, green light and blue light are emitted, are illustrated. For example, the display device DD according to an embodiment may include a red light-emitting region PXA-R, a green light-emitting region PXA-G, and a blue light-emitting region PXA-B, which are distinct from each other.

In FIGS. 1 and 2, all the areas of the light-emitting regions PXA-R, PXA-G, and PXA-B are illustrated as being similar. However, an embodiment of the inventive concept is not limited thereto, and the areas of light-emitting regions PXA-R, PXA-G and PXA-B may be different from each other according to wavelength regions of light emitted. The areas of light-emitting regions PXA-R, PXA-G and PXA-B may refer to areas as seen on a plane defined by the first direction axis DR1 and the second direction axis DR2.

Referring to FIG. 2, the display device DD may include a display panel DP. The display panel DP may include a base layer BS1, a circuit layer DP-CL disposed on the base layer BS1, a display element layer DP-ED disposed on the circuit layer DP-CL, and an encapsulation layer TFE disposed on the display element layer DP-ED.

In addition, the display device DD may include a light control layer CCL disposed on the display element layer DP-ED, and a color filter layer CFL disposed on the light control layer CCL. The display element layer DP-ED may include pixel definition films PDL and a light-emitting element ED disposed between the pixel definition films PDL. On the light-emitting element ED, the encapsulation layer TFE may be disposed.

The base layer BS1 may be a member for providing a base surface on which the display element layer DP-ED is disposed. The base layer BS1 may be a glass substrate, a metal substrate, a plastic substrate, or the like. However, an embodiment of the inventive concept is not limited thereto, and the base layer BS1 may be an inorganic layer, an organic layer, or a composite material layer.

In an embodiment, the circuit layer DP-CL may be disposed on the base layer BS1, and may include a plurality of transistors. Each of the transistors (may include a control electrode, an input electrode, and an output electrode. For examples, the circuit layer DP-CL may include a switching transistor and driver transistor for driving the light-emitting element ED of the display element layer DP-ED.

The light-emitting element ED may include a first electrode EL1, a hole transport region HTR, a light-emitting layer EML, an electron transport region ETR and a second electrode EL2. The light-emitting element ED may include a plurality of light-emitting layers. The plurality of light-emitting layers may be sequentially stacked. For example, the light-emitting element including a plurality of light-emitting layers may have a tandem structure.

In FIG. 2, the hole transport region HTR, the light-emitting layer EML, the electron transport region ETR and the second electrode EL2 are illustrated as common layers. However, an embodiment of the inventive concept is not limited thereto, and the hole transport region HTR, the light-emitting layer EML and the electron transport region ETR may be provided by being patterned in openings OH defined by a pixel definition film PDL.

The encapsulation layer TFE may cover the light-emitting element ED. The encapsulation layer TFE may be disposed on the second electrode EL2. The encapsulation layer TFE may seal the display element layer DP-ED. The encapsulation layer TFE may be a thin-film encapsulation layer. The encapsulation layer TFE may be a single layer or a plurality of layers stacked. The encapsulation layer TFE may include at least one organic film and at least one inorganic film.

A charge layer BFL may be disposed between the display element layer DP-ED and the light control layer CCL. The charge layer BFL may include an organic material. For example, the charge layer BFL may include at least one of an acrylate-based resin, a silicone-based resin or an epoxy-based resin.

A capping layer CPL may be further disposed between the light control layer CCL and the charge layer BFL. The capping layer CPL may play a role of preventing the penetration of moisture and/or oxygen. The capping layer CPL may block light control parts CL-1, CL-2 and CL-3 of the light control layer CCL from being exposed to moisture and/or oxygen.

The light control layer CCL may include a plurality of light control parts CL-1, CL-2 and CL-3. The light control parts CL-1, CL-2 and CL-3 may be spaced apart from each other. Partition walls BM may be disposed between the light control parts CL-1, CL-2 and CL-3. The partition walls BM may be a black matrix. The partition walls BM may include an organic light-shielding material or an inorganic light-shielding material containing a black pigment or a black dye.

The light control parts CL-1, CL-2 and CL-3 may include a first light control part CL-1 that converts first color light into second color light, a second light control part CL-2 that converts the first color light into third color light, and a third light control part CL-3 that transmits the first color light. The first color light may be supplied from the light-emitting element ED. The first color light may be blue light.

The first light control part CL-1 may supply red light that is the second color light, the second light control part CL-2 may supply green light that is the third color light, and the third light control part CL-3 may transmit and supply blue light that is the first color light. For example, the first light control part CL-1 may include a red quantum dot, and the second light control part CL-2 may include a green quantum dot. The light control parts CL-1, CL-2 and CL-3 will be described in more detail later.

An insulating layer PA and a low-refractive layer LR may be disposed between the light control layer CCL and the color filter layer CFL. The insulating layer PA may be disposed on the light control layer CCL, and the low-refractive layer LR may be disposed on the insulating layer PA. The insulating layer PA may be optically transparent. The insulating layer PA may be composed of a single layer or a plurality of layers. In addition, otherwise illustrated, the insulating layer PA may be omitted in some implementations of the embodiment described herein.

The low-refractive layer LR may have a lower refractive index than the color filter layer CFL and light control layer CCL that are adjacent to the low-refractive layer LR. The low-refractive layer LR may cause a portion of blue light emitted in a direction from the light control layer CCL to the color filter layer CFL to be totally reflected and to be re-incident on the light control layer CCL. The blue light may be emitted from the light-emitting element ED. A portion of the blue light may be re-incident on the first light control part CL-1 or second light control part CL-2 included in the light control layer CCL. As described above, the first light control part CL-1 may convert the re-incident blue light into red light, and the second light control part CL-2 may convert the re-incident blue light into green light. Such recirculation of light may increase light efficiency of the display device DD.

The color filter layer CFL may include a first filter CF-1, a second filter CF-2 and a third filter CF-3. The first filter CF-1 may transmit second color light, the second filter CF-2 may transmit third color light, and the third filter CF-3 may transmit first color light. For example, the first filter CF-1 may be a red filter, the second filter CF-2 may be a green filter, and the third filter CF-3 may be a blue filter.

The first filter CF-1 may be provided in a red light-emitting region PXA-R and a non-light emitting region NPXA, and the second filter CF-2 may be provided in a green light-emitting region PXA-G and a non-light emitting region NPXA. In addition, the third filter CF-3 may be provided in a blue light-emitting region PXA-B and a non-light emitting region NPXA. In the non-light emitting region NPXA, at least two filters of the first to third filters CF-1, CF-2 and CF-3 may overlap. For examples, in the non-light emitting region NPXA, all of the first to third filters CF-1, CF-2 and CF-3 may overlap. However, an embodiment of the inventive concept is not limited thereto, and the non-light emitting region may not be provided with the first to third filters and may be provided with a black matrix including an organic light-shielding material or inorganic light-shielding material.

Each of the first to third filters CF-1, CF-2 and CF-3 may include a photosensitive polymer resin and a pigment or dye. However, an embodiment of the inventive concept is not limited thereto, and the third filter CF-3 may not include a pigment or a dye. The third filter CF-3 may be transparent. In addition, the first filter CF-1 and the second filter CF-2 may be yellow filters. The first filter CF-1 and the second filter CF-2 may be supplied integrally, not separately.

A base substrate BS2 may be a member for providing a base surface on which the light control layer CCL, the color filter layer CFL, etc. are disposed. The base substrate BS2 may be a glass substrate, a metal substrate, a plastic substrate, or the like. However, an embodiment of the inventive concept is not limited thereto, and the base substrate BS2 may be an inorganic layer, an organic layer, or a composite material layer. At least one of a hard coating layer or an anti-fingerprint layer may be provided on the base substrate BS2. In addition, otherwise illustrated, the base substrate BS2 may be omitted in some implementations of the embodiment described herein.

Figure 3:
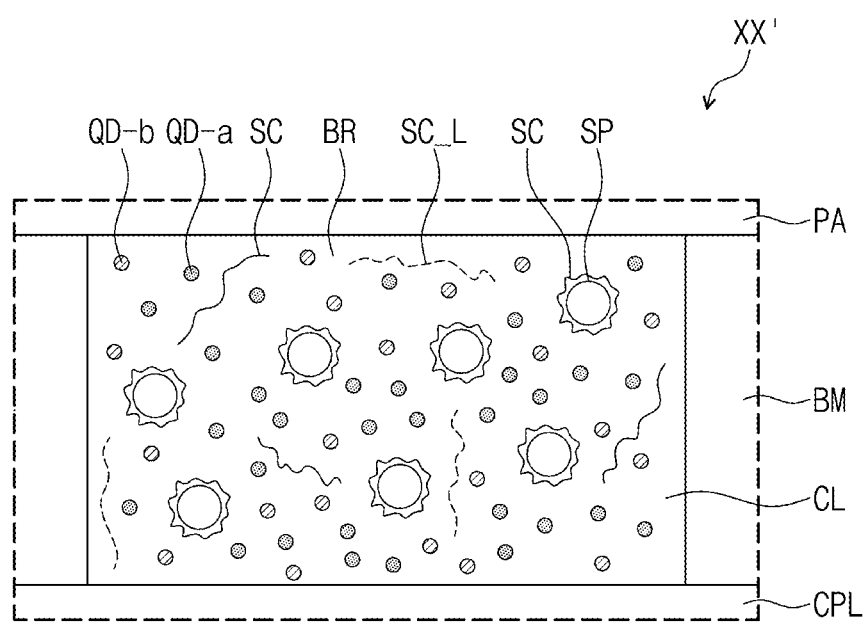
FIG. 3 is a cross-sectional view taken along region XX' illustrated in FIG. 2.

At least one of the light control parts CL-1, CL-2 and CL-3 in the light control layer CCL may be formed from a quantum dot composition QR (see FIGS. 10B and 11A) according to an embodiment described later. FIG. 3 may illustrate in detail at least one of the first to third light control parts CL-1, CL-2 and CL-3 according to an embodiment. For example, the light control part CL of FIG. 3 may be at least one of the first light control part CL-1 or the second light control part CL-2. Hereinafter, the description of the light control part CL may be similarly applied to at least one of the first to third light control parts CL-1, CL-2 and CL-3.

FIGS. 3, 5A, 6, 7A, 7B, and 8 illustrate enlarged parts taken along region XX' illustrated in FIG. 2. Referring to FIG. 3, the light control part CL may include a scatterer SP, quantum dots QD-a and QD-b, a polymer resin BR, and a dispersant SC. In addition, the light control part CL may include a plurality of ligands LD (see FIG. 4B). The ligands LD may bind to the quantum dot QD-b or may be detached from the quantum dots QD-a and QD-b. In an embodiment, at least one of the ligands LD may bind to the polymer resin BR, the dispersant SC, or the partition wall BM. The ligand LD detached from the quantum dot QD-b may bind to an element including the same material as shells of the quantum dots QD-a and QD-b.

Region XX' in FIG. 3 indicates a region where the dispersant SC includes the same material as shells of quantum dots QD-a and QD-b. In addition, region XX' in FIG. 3 may indicate a region where the polymer resin BR includes the same material as shells of quantum dots QD-a and QD-b.

Figure 5A:
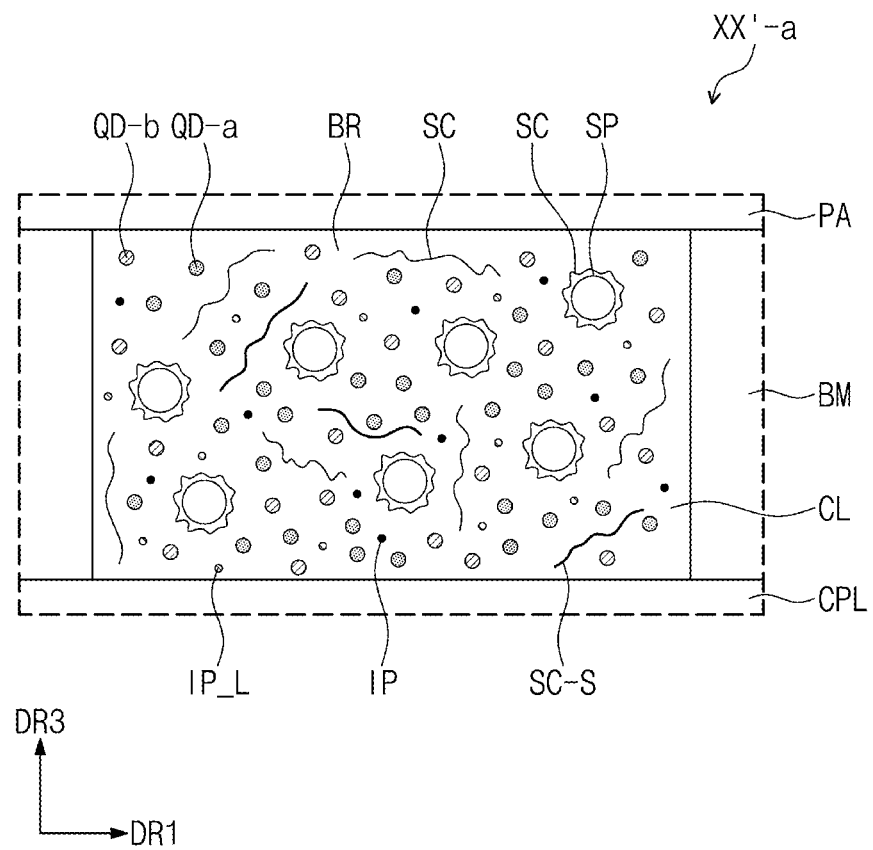
FIG. 5A is a cross-sectional view illustrating a part of a display device according to an embodiment.

Region XX'-a in FIG. 5A indicates a region where the light control part CL further includes an inorganic particle IP, and the inorganic particle IP includes the same material as shells of quantum dots QD-a and QD-b. Region XX'-b in FIG. 6 indicates a region where the light control layer CCL further includes a cover layer CV, and the cover layer CV includes the same material as shells of quantum dots QD-a and QD-b.

Figure 6:
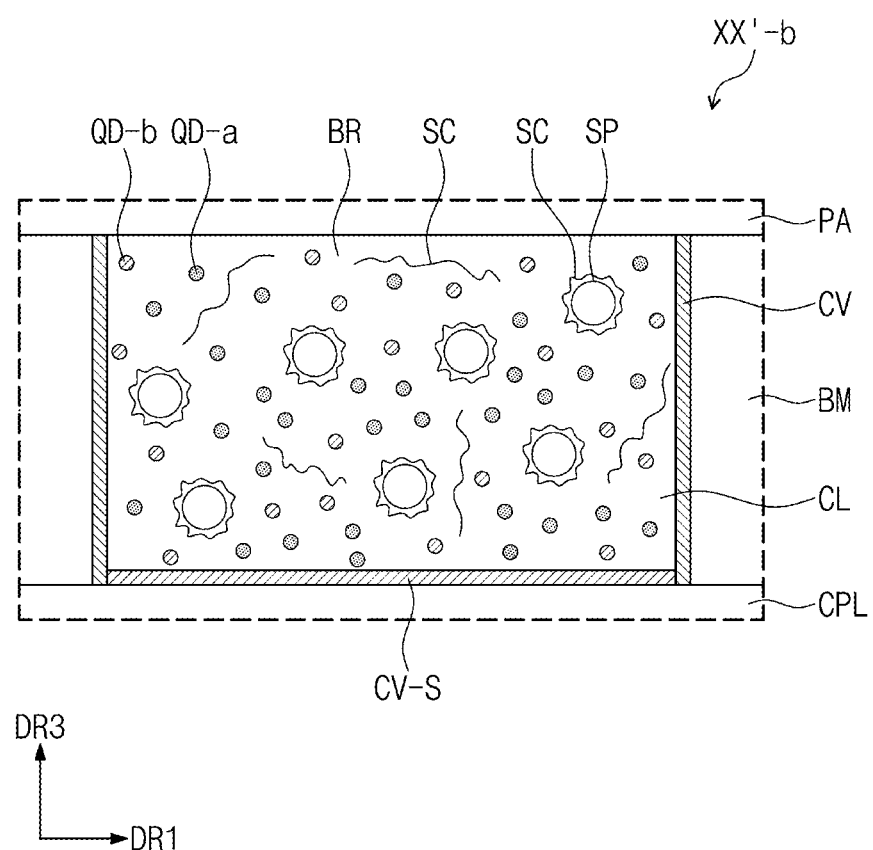
FIG. 6 is a cross-sectional view illustrating a part of a display device according to an embodiment.
Figure 7A:
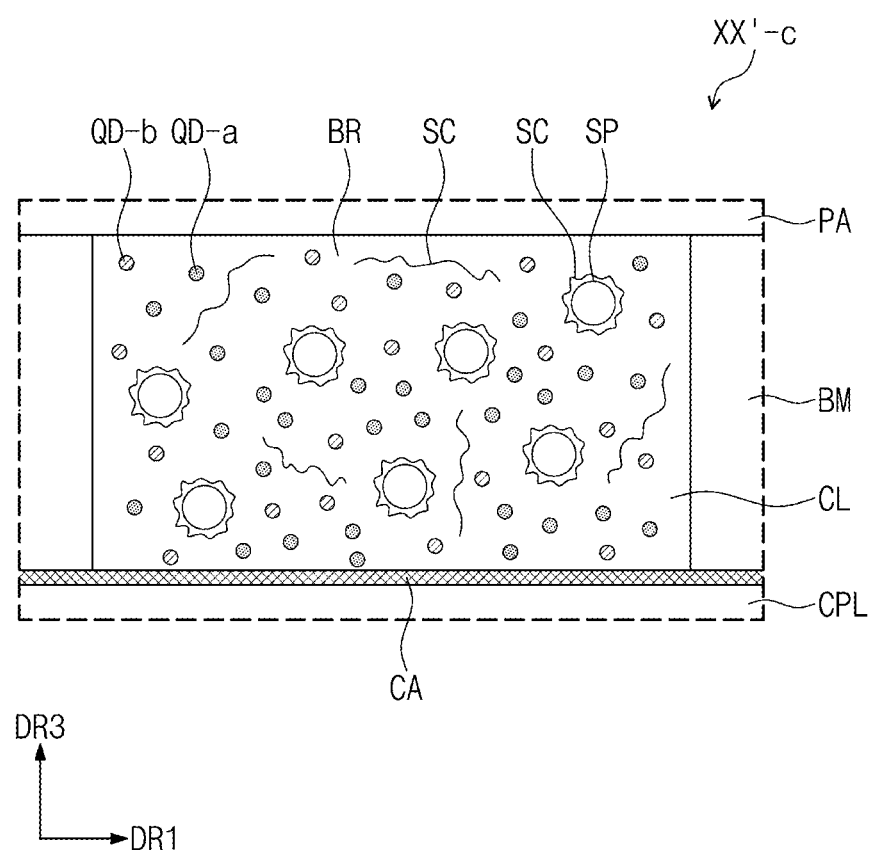
FIG. 7A is a cross-sectional view illustrating a part of a display device according to an embodiment.
Figure 7B:
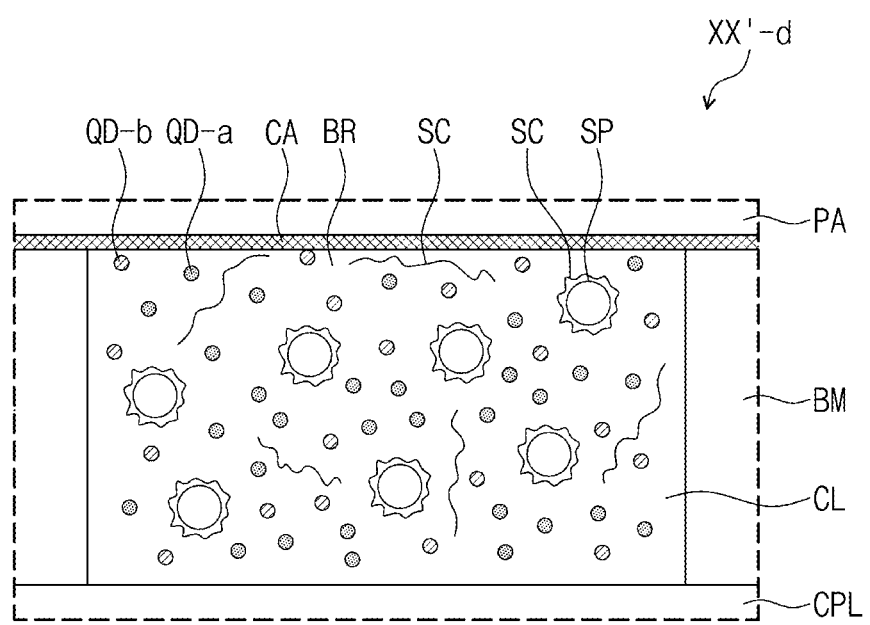
FIG. 7B is a cross-sectional view illustrating a part of a display device according to an embodiment.

Region XX'-c in FIG. 7A and region XX'-d in FIG. 7B indicate regions where a coating layer CA is disposed on one surface or another surface of the light control layer CCL, and the coating layer CA includes the same material as shells of quantum dots QD-a and QD-b. Region XX'-e in FIG. 8 indicates a region where the partition walls BM include the same material as shells of quantum dots QD-a and QD-b. FIGS. 5A, 6, 7A, 7B, and 8 will be described in more detail later.

In FIG. 3, the scatterer SP may include an inorganic material. For example, the scatterer SP may include at least one of $TiO_2$, $ZnO$, $Al_2O_3$, $SiO_2$ or hollow silica. The scatterer SP may include one of $TiO_2$, $ZnO$, $Al_2O_3$, $SiO_2$ or hollow silica, or may be a mixture of at least two types of materials selected from $TiO_2$, $ZnO$, $Al_2O_3$, $SiO_2$ and hollow silica. The scatterer SP may be dispersed in the polymer resin BR. The scatterer SP may be dispersed by a dispersant SC. A plurality of dispersants SC may be provided so as to disperse scatterers SP, and some of the dispersants SC may surround the scatterers SP.

Figure 4A:
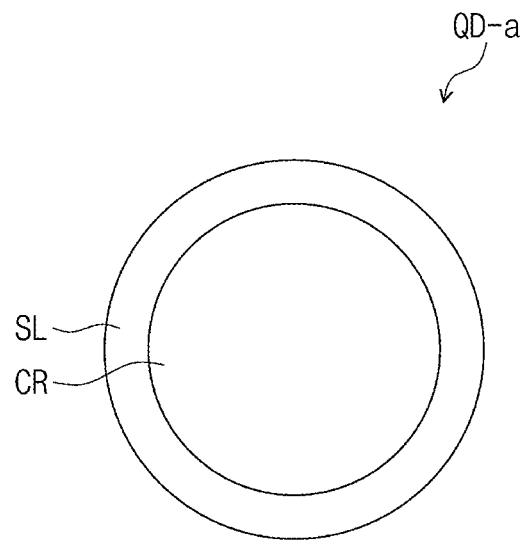
FIG. 4A illustrates a part of a display device according to an embodiment.
Figure 4B:
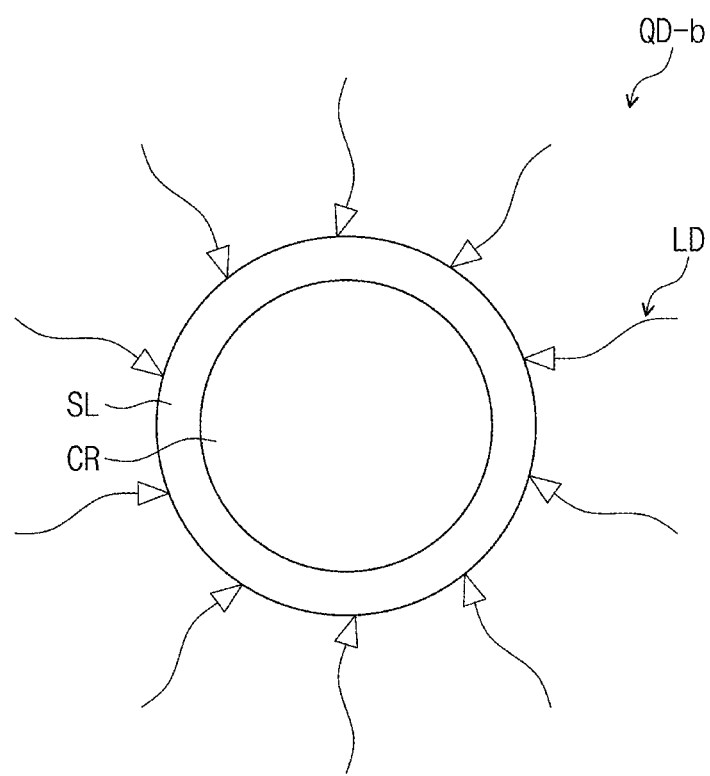
FIG. 4B illustrates a part of a display device according to an embodiment.

The light control part CL may include a quantum dot QD-a (hereinafter referred to as a first quantum dot) from which a ligand LD is detached, and a quantum dot QD-b (hereinafter referred to as a second quantum dot) to which a ligand LD binds. In the light control part CL of the display device DD, the number of first quantum dots QD-a may be greater than the number of second quantum dots QD-b. Referring to FIGS. 4A and 4B, each of the first quantum dot QD-a and the second quantum dot QD-b may include a core CR and a shell SL surrounding the core CR. The core CR of the first quantum dot QD-a may be the same as the core CR of the second quantum dot QD-b. In addition, the shell SL of the first quantum dot QD-a may be the same as the shell SL of the second quantum dot QD-b. The first quantum dot QD-a and the second quantum dot QD-b may be the same material except for whether ligands bind thereto or not.

The core CR of the first quantum dot QD-a and the core CR of the second quantum dot QD-b may be selected from a group II-VI compound, a group III-VI compound, a group I-III-VI compound, a group III-V compound, a group III-II-V compound, a group IV-VI compound, a group IV element, a group IV compound and a combination thereof.

The group II-VI compound may be selected from the group consisting of: a binary compound selected from the group consisting of CdSe, CdTe, CdS, ZnS, ZnSe, ZnTe, ZnO, HgS, HgSe, HgTe, MgSe, MgS and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe and a mixture thereof.

The group III-VI compound may include a binary compound such as $In_2S_3$ and $In_2Se_3$; a ternary compound such as $InGaS_3$ and $InGaSe_3$; or any combination thereof.

The group I-III-VI compound may be selected from a ternary compound selected from the group consisting of $AgInS$, $AgInS_2$, $CuInS$, $CuInS_2$, $AgGaS_2$, $CuGaS_2$ $CuGaO_2$, $AgGaO_2$, $AgAlO_2$ and a mixture thereof; or a quaternary compound such as $AgInGaS_2$, $CuInGaS_2$, and $AgInGaS_2$.

The group III-V compound may be selected from the group consisting of: a binary compound selected from the group consisting of GaN, GaP, GaAs, GaSb, AlN, AlP, AlAs, AlSb, InN, InP, InAs, InSb and a mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb and a mixture thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and a mixture thereof. The group III-V compound may further include a group II metal. For example, InZnP or the like may be selected as a group III-II-V compound.

The group IV-VI compound may be selected from the group consisting of: a binary compound selected from the group consisting of SnS, SnSe, SnTe, PbS, PbSe, PbTe and a mixture thereof; a ternary compound selected from the group consisting of SnSeS, SnSeTe, SnSTe, PbSeS, PbSeTe, PbSTe, SnPbS, SnPbSe, SnPbTe and a mixture thereof; and a quaternary compound selected from the group consisting of SnPbSSe, SnPbSeTe, SnPbSTe and a mixture thereof. The group IV element may be selected from the group consisting of Si, Ge and a mixture thereof. The group IV compound may be a binary compound selected from the group consisting of selected from SiC, SiGe and a mixture thereof.

The shells SL of the first quantum dot QD-a and the second quantum dot QD-b may each include a metal or non-metal oxide, a semiconductor compound, or a combination thereof. For example, the shells SL may each include at least one of $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, $MgAl_2O_4$, $CoFe_2O_4$, $NiFe_2O_4$, $CoMn_2O_4$, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb. However, this is illustrative of one possible implementation of an embodiment, and an embodiment consistent with one or more of the inventive concepts is not limited thereto.

Referring to FIG. 4B, a plurality of ligands LD may bind to the surface of the shell SL of the second quantum dot QD-b. At least one of the plurality of ligands LD may be detached from the shell SL due to at least one of heat or light. At least one of the plurality of ligands LD may bind to a polymer resin BR, a dispersant SC, or partition walls BM. At least one of the plurality of ligands LD may bind to a polymer resin BR, a dispersant SC, or partition walls BM including the same material as the shell SL of the second quantum dot QD-b. At least one of a polymer resin BR, a dispersant SC, or partition walls BM may include the same material as the shell SL of the second quantum dot QD-b.

In this specification, including the same material as a shell denotes the of including of a compound itself constituting the shell, or identically including some materials of the compound constituting the shell. For example, when the shell SL includes a metal oxide, an element including the same material as the shell SL may include the same metal material as the shell SL. When the shell SL includes a non-metal oxide, an element including the same material as the shell SL may include the same non-metal material as the shell SL. A metal material or non-metal material, which is same as a metal or non-metal included in the shell SL, may bind to a compound included in the polymer resin BR, the dispersant SC, or the partition walls BM. In addition, a metal material or non-metal material, which is same as a metal or non-metal included in the shell SL, may bind to a compound included in the cover layer CV or coating layer CA.

When the shell SL includes a metal oxide or non-metal oxide, the light control layer CCL may include the metal oxide or non-metal oxide in the form of particles. The particles formed of the same material as the metal oxide or non-metal oxide included in the shell SL may be dispersed in the light control part CL, the cover layer CV, the coating layer CA or the partition walls BM. However, this is illustrative as one possible implementation of an embodiment, and a material included in the shell SL and an element including the same material as the shell SL are not limited to any one embodiment.

In an embodiment, the dispersant SC (hereinafter referred to as a first dispersant) may include the same material as a shell SL of a second quantum dot QD-b. A ligand LD may bind to a dispersant SC_L (hereinafter referred to as a second dispersant) including the same material as the shell SL of the second quantum dot QD-b. The first dispersant SC and the second dispersant SC_L may include the same material except for whether the ligand LD binds thereto or not.

The first dispersant SC and the second dispersant SC_L may each include at least one of an acidic substituent or a basic substituent. For example, the first dispersant SC and the second dispersant SC_L may each include at least one of a polyacrylate, a polyurethane, a polyethylene, a polyester or an epoxy resin. The polyacrylate, polyurethane, polyethylene, polyester and epoxy resin may each include at least one of an acidic substituent or a basic substituent. In addition, the polyacrylate, polyurethane, polyethylene, polyester and epoxy resin may include the same material as the shells SL of the first quantum dot QD-a and the second quantum dot QD-b. For example, the shells SL of the first quantum dot QD-a and the second quantum dot QD-b may include Zn, Ga or S, and, like the shells SL, the first dispersant SC and the second dispersant SC_L may also include Zn, Ga or S. However, this is illustrative as one possible implementation of an embodiment, and materials included in the first dispersant SC and the second dispersant SC_L are not limited to any one embodiment.

In this specification, the term "substituted or unsubstituted" may mean being substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon cyclic group, an aryl group and a heterocyclic group. In addition, each of the substituents listed above may be substituted or unsubstituted. For example, a biphenyl group may be construed as an aryl group or as a phenyl group-substituted phenyl group.

In this specification, the alkyl group may be a linear, branched or cyclic group. The carbon number of the alkyl group may be 1 to 30, 1 to 20, 1 to 10, or 1 to 6. Examples of the alkyl group include a methyl group, an ethyl group, an n-propyl group, an isopropyl group, an n-butyl group, an s-butyl group, a t-butyl group, an i-butyl group, a 2-ethyl-butyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, etc., but an embodiment of the inventive concept is not limited thereto.

In this specification, the alkenyl group refers to a hydrocarbon group including one or more carbon double bonds in the middle of or at the terminal of an alkyl group having two or more carbon atoms. The alkenyl group may have a linear chain or a branched chain. The carbon number of the alkenyl group is not specifically limited to but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., but an embodiment of the inventive concept is not limited thereto.

In this specification, the alkynyl group refers to a hydrocarbon group including one or more carbon triple bonds in the middle of or at the terminal of an alkyl group having two or more carbon atoms. The alkynyl group may have a linear chain or a branched chain. The carbon number of the alkynyl group is not specifically limited to but may be 2 to 30, 2 to 20, or 2 to 10. Examples of the alkynyl group may include an ethynyl group, a propynyl group, etc., but an embodiment of the inventive concept is not limited thereto.

In this specification, the aryl group refers to any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but an embodiment of the inventive concept is not limited thereto.

In this specification, the explanation on the alkyl group may be applied to a divalent alkyl group except that the divalent alkyl group is a divalent group. The explanation on the alkenyl group may be applied to a divalent alkenyl group except that the divalent alkenyl group is a divalent group. The explanation on the alkynyl group may be applied to a divalent alkynyl group except that the divalent alkynyl group is a divalent group. The explanation on the aryl group may be applied to an arylene group except that the arylene group is a divalent group.

For example, the first dispersant SC and the second dispersant SC_L may each include a material represented by one of the following Formulae 1 to 3. Formula 1 may include a structural formula of polyacrylate, Formula 2 may include a structural formula of polyurethane, and Formula 3 may include a structural formula of polyethylene.

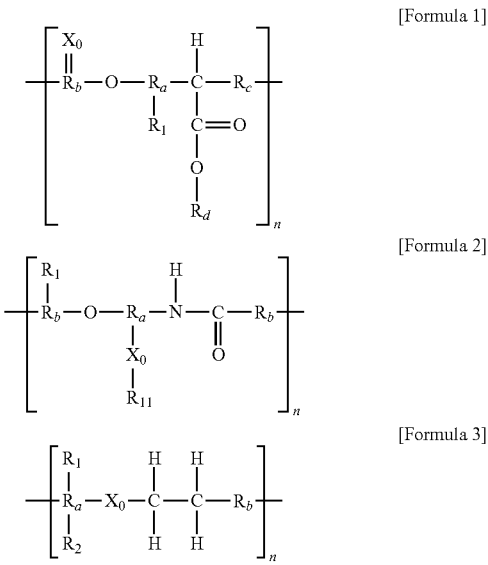

In Formulae 1 to 3, each n may be independently an integer of 10 to 1000. $X_0$ and $R_{11}$ may be each independently the same material as those of the shells SL of the first quantum dot QD-a and the second quantum dot QD-b. A ligand LD may bind to $X_0$. For example, the shells SL of the first quantum dot QD-a and the second quantum dot QD-b may include Zn, and $X_0$ may be Zn. However, this is illustrative as one possible implementation of an embodiment, and an embodiment consistent with one or more of the inventive concepts is not limited thereto.

$R_a$ to $R_c$ may be each independently an aliphatic hydrocarbon or an aromatic hydrocarbon. For example, $R_a$ to $R_c$ may be each independently a substituted or unsubstituted divalent alkyl group having 1 to 30 carbon atoms, a substituted or unsubstituted divalent alkenyl group having 2 to 30 carbon atoms, a substituted or unsubstituted divalent alkynyl group having 2 to 30 carbon atoms, or a substituted or unsubstituted arylene group having 6 to 30 ring-forming carbon atoms.

In Formulae 1 to 3, $R_1$ and $R_2$ may be each independently an acidic substituent or a basic substituent. For example, in Formula 3, where both $R_1$ and $R_2$ are acidic substituents, the dispersants SC and SC_L each including a material represented by Formula 3 may exhibit acidity. In addition, in Formula 3, where both $R_1$ and $R_2$ are basic substituents, the dispersants SC and SC_L each including a material represented by Formula 3 may exhibit basicity. In Formula 3, where one of $R_1$ and $R_2$ is an acidic substituent and the other is a basic substituent, the dispersants SC and SC_L each including a material represented by Formula 3 may exhibit both acidity and basicity.

Figure 4C:
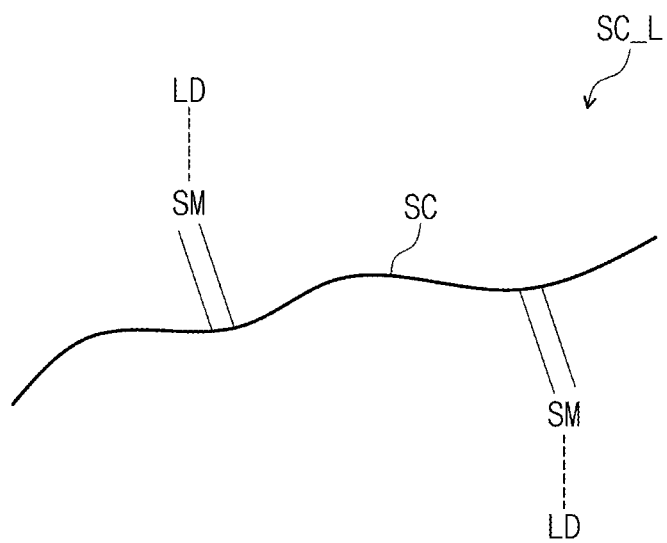
FIG. 4C illustrates a part of a display device according to an embodiment.

FIG. 4C schematically illustrates the second dispersant SC_L to which the ligand LD binds. In the first dispersant SC including the same material SM as the shells SL of the first quantum dot QD-a and the second quantum dot QD-b, the ligand LD may bind to the same material SM as the shells SL to form the second dispersant SC_L. The binding of one material SM and one ligand LD is illustrated, but an embodiment of the inventive concept is not limited thereto. For example, one ligand LD may bind to two materials SM.

In an embodiment, the polymer resin BR may include the same material as the shells SL of the first quantum dot QD-a and the second quantum dot QD-b. The same material as a material included in the shells SL may bind to a main chain of a polymer material included in the polymer resin BR. For example, the shells SL of the first quantum dot QD-a and the second quantum dot QD-b may include Zn, Ga or S, and like the shells SL, the polymer resin BR may also include Zn, Ga or S. However, this is illustrative as one possible implementation of an embodiment, and a material of the polymer resin BR is not limited to any one embodiment.

The polymer resin BR may have a vapor pressure of $10^{-3}$ mmHg or less. A polymer resin having a vapor pressure greater than $10^{-3}$ mmHg may not be suitable for forming a light control part because of its high volatility.

The polymer resin BR may include an acrylate-based compound, a diacrylate-based compound, or a methacrylate-based compound. For example, the polymer resin BR may include a material represented by the following Formula 4. Formula 4 may be a material including a diacrylate group.

[Formula 4]

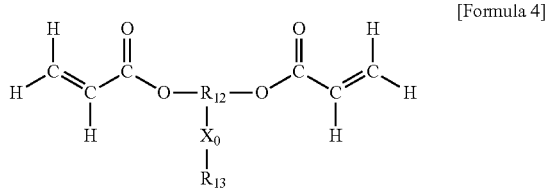

In Formula 4, $X_0$ may be the same material as those of the shells SL of the first quantum dot QD-a and the second quantum dot QD-b. A ligand LD may bind to $X_0$. For example, the shells SL of the first quantum dot QD-a and the second quantum dot QD-b may each include Zn, and $X_0$ may be Zn. However, this is illustrative as one possible implementation of an embodiment, and an embodiment consistent with one or more of the inventive concept is not limited thereto.

In Formula 4, $R_{12}$ and $R_{13}$ may be each independently an aliphatic hydrocarbon or an aromatic hydrocarbon. For example, $R_{12}$ may be a substituted or unsubstituted divalent alkyl group having 1 to 30 carbon atoms, a substituted or unsubstituted divalent alkenyl group having 2 to 30 carbon atoms, a substituted or unsubstituted divalent alkynyl group having 2 to 30 carbon atoms, or a substituted or unsubstituted arylene group having 6 to 30 carbon atoms. $R_{13}$ may be a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, or a substituted or unsubstituted aryl group having 6 to 30 ring-forming carbon atoms.

In an embodiment, the light control part CL may further include inorganic particles IP containing the same material as the shells SL of a first quantum dot QD-a and a second quantum dot QD-b. FIG. 5A illustrates that the light control part CL further includes inorganic particles IP.

The inorganic particles IP may be dispersed in the polymer resin BR. The light control part CL may be provided with a sub dispersant SC-S that disperses the inorganic particles IP. The sub dispersant SC-S may be the same as the first dispersant SC. The sub dispersant SC-S may include the same material as the shells SL of the first quantum dot QD-a and the second quantum dot QD-b. The sub dispersant SC-S may be different from the first dispersant SC. The sub dispersant SC-S may not include the same material as the shells SL of the first quantum dot QD-a and the second quantum dot QD-b.

In an embodiment, an inorganic particle IP (hereinafter referred to as a first inorganic particle) may include the same material as the shells SL of the first quantum dot QD-a and the second quantum dot QD-b. For example, the shells SL of the first quantum dot QD-a and the second quantum dot QD-b may include Zn, Ga or S, and like the shells SL, the inorganic particle IP may also include Zn, Ga or S. However, this is illustrative as one possible implementation of an embodiment, and a material included in the inorganic particle IP is not limited to any one embodiment.

A ligand LD may bind to an inorganic particle IP_L (hereinafter referred to as a second inorganic particle) including the same material as the shells SL of the first quantum dot QD-a and the second quantum dot QD-b. The first inorganic particle IP and the second inorganic particle IP_L may include the same material except for whether the ligand LD binds thereto or not.

Figure 5B:
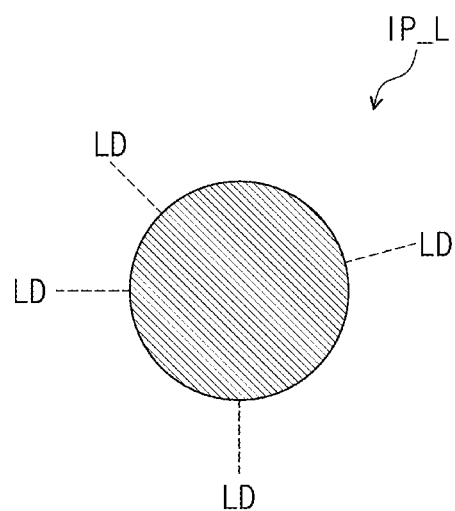
FIG. 5B illustrates a part of a display device according to an embodiment.

FIG. 5B schematically illustrates a second inorganic particle IP_L to which a ligand LD binds. It is illustrated that the number of ligands LD binding to the inorganic particle IP_L is 4, but this is illustrative as one possible implementation of an embodiment. The number of ligands LD binding to the inorganic particle IP_L is not limited to any one embodiment.

In an embodiment, the light control layer CCL may further include a cover layer CV containing the same material as the shells SL of the first quantum dot QD-a and the second quantum dot QD-b. Referring to FIG. 6, the cover layer CV may cover side surfaces of partition walls BM adjacent to the light control part CL. The cover layer CV may be disposed on the side surfaces of the partition walls BM, and at least one of ligands LD (see FIG. 4B) may bind thereto. For example, the shells SL of the first quantum dot QD-a and the second quantum dot QD-b may include Zn, Ga or S, and like the shells SL, the cover layer CV may also include Zn, Ga or S. However, this is illustrative as one possible implementation of an embodiment, and a material of the cover layer CV is not limited to any one embodiment.

In addition, the light control layer CCL may further include a sub cover layer CV-S containing the same material as the shells SL of the first quantum dot QD-a and the second quantum dot QD-b. For example, the shells SL of the first quantum dot QD-a and the second quantum dot QD-b may include Zn, Ga or S, and like the shells SL, the sub cover layer CV-S may also include Zn, Ga or S. However, this is illustrative as one possible implementation of an embodiment, and a material of the sub cover layer CV-S is not limited to any one embodiment.

The sub cover layer CV-S may cover one surface of the light control part CL adjacent to the display element layer DP-ED (see FIG. 2). More specifically, the sub cover layer CV-S may cover one surface of the light control part CL adjacent to the capping layer CPL. The sub cover layer CV-S may non-overlap the partition walls BM. At least one of ligands LD (see FIG. 4B) may bind to the sub cover layer CV-S that covers one surface of the light control part CL. Otherwise illustrated, the sub cover layer CV-S may be omitted from the light control layer CCL in some implementations of the embodiment described herein, and the cover layer CV alone may be disposed in some implementations of the embodiment described herein.

FIGS. 7A and 7B illustrate a coating layer CA disposed on an upper surface or a lower surface of the light control layer CCL. The display device DD according to an embodiment may further include the coating layer CA disposed on the upper surface or the lower surface of the light control layer CCL. The coating layer CA may overlap the light control part CL and the partition walls BM. FIG. 7A illustrates that the coating layer CA is disposed on the lower surface of the light control layer CCL adjacent to the display element layer DP-ED (see FIG. 2). FIG. 7B illustrates that the coating layer CA is disposed on the upper surface of the light control layer CCL adjacent to a color filter layer CFL.

The coating layer CA may include the same material as the shells SL of the first quantum dot QD-a and the second quantum dot QD-b. At least one of ligands LD (see FIG. 4B) may bind to the coating layer CA adjacent to the light control part CL. For example, the shells SL of the first quantum dot QD-a and the second quantum dot QD-b may include Zn, Ga or S, and like the shells SL, the coating layer CA may also include Zn, Ga or S. However, this is illustrative as one possible implementation of an embodiment, and a material of the coating layer CA is not limited to any one embodiment.

Figure 8:
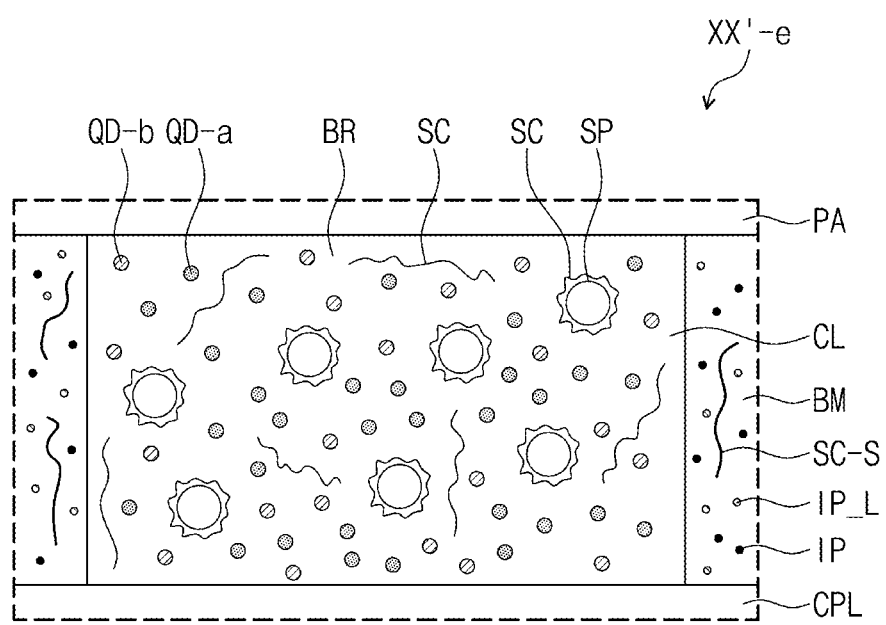
FIG. 8 is a cross-sectional view illustrating a part of a display device according to an embodiment.

FIG. 8 illustrates that the partition walls BM include the same material as the shells SL of the first quantum dot QD-a and the second quantum dot QD-b. The partition walls BM may include inorganic particles IP formed of the same material as the shells SL of the first quantum dot QD-a and the second quantum dot QD-b. The partition walls BM including the inorganic particles IP may each be provided with a sub dispersant SC-S. The partition walls BM may include a compound formed of the same material as the shells SL of the first quantum dot QD-a and the second quantum dot QD-b. At least one of ligands LD may bind to the partition walls BM including the compound formed of the same material as the shells SL of the first quantum dot QD-a and the second quantum dot QD-b. For example, the shells SL of the first quantum dot QD-a and the second quantum dot QD-b may include Zn, Ga or S, and like the shells SL, the partition walls BM may also include Zn, Ga or S. However, this is illustrative as one possible implementation of an embodiment, and materials of the partition walls BM are not limited to any one embodiment.

At least one of ligands LD may bind to the partition walls BM including the inorganic particle IP formed of the same material as the shells SL of the first quantum dot QD-a and the second quantum dot QD-b. At least one of ligands LD may bind to a first inorganic particle IP to form a second inorganic particle IP_L. The first inorganic particle IP and the second inorganic particle IP_L may include the same material except for whether the ligand LD binds thereto or not. The partition walls BM or the light control part CL (see FIG. 5A) may include the first inorganic particle IP and the second inorganic particle IP_L.

A display device having a quantum dot includes a ligand binding to the quantum dot, and a ligand detached from the quantum dot. The ligand is detached from the quantum dot due to at least one of heat or light generated under display device manufacturing and driving environments. The detached ligand causes an overshoot of the display device.

In an embodiment, the light control part CL may include quantum dots QD-a and QD-b, and the quantum dots QD-a and QD-b may each include a core CR and a shell SL surrounding the core CR. A plurality of ligands LD may bind to surfaces of the shells SL or may be detached from the surfaces of the shells SL due to at least one of heat or light. At least one of the plurality of ligands LD may bind to the polymer resin BR, the dispersant SC, or the partition walls BM. At least one of the polymer resin BR, the dispersant SC, or the partition walls BM may include the same material as the shells SL of the quantum dots QD-a and QD-b.

Since an element included in the light control part CL or an element adjacent to the light control part CL includes the same material as the shells SL of the quantum dots QD-a and QD-b, at least one of the ligands LD may bind to the element including the same material as the shells SL of the quantum dots QD-a and QD-b. Accordingly, the overshoot caused by the ligands in the light control layer of the display device may be stabilized. In the display device DD according to an embodiment, as at least one of the polymer resin BR, the dispersant SC, or the partition walls BM includes the same material as the shells SL of the quantum dots QD-a and QD-b, the display device may exhibit stabilized efficiency.

Figure 9A:
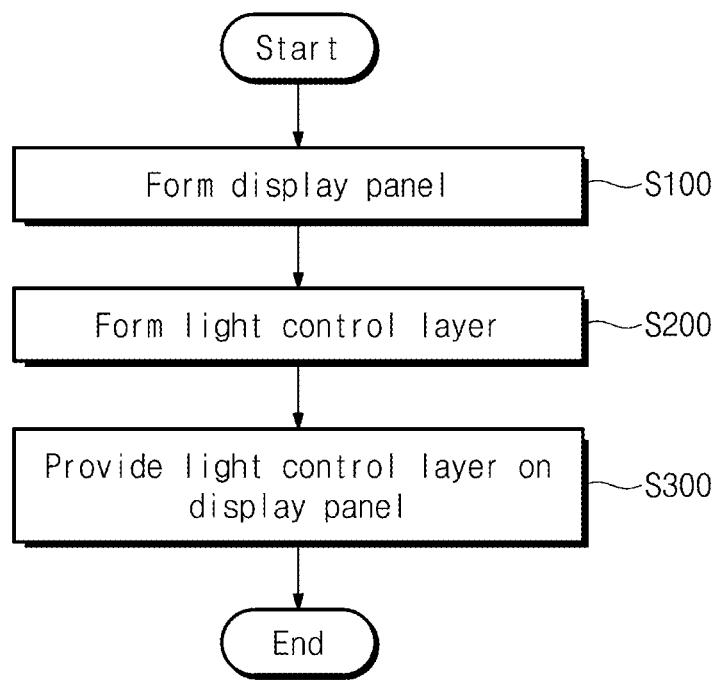
FIG. 9A is a flowchart of a display device manufacturing method according to an embodiment.
Figure 9B:
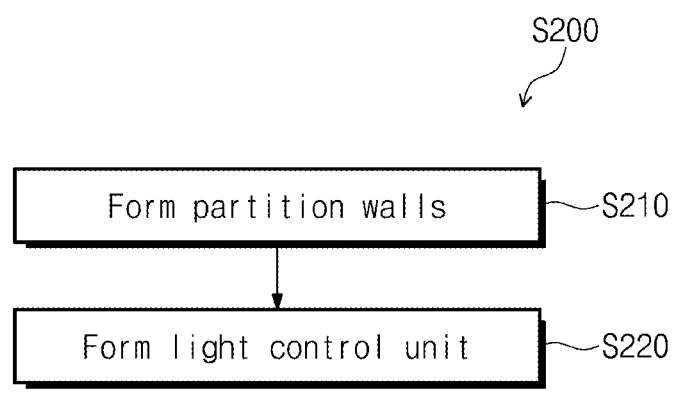
FIG. 9B is a flowchart of a display device manufacturing method according to an embodiment.

In an embodiment, the light control layer CCL may be formed by a display device manufacturing method according to an embodiment. FIGS. 9A and 9B are each a flowchart illustrating a display device manufacturing method according to an embodiment. FIGS. 10A to 11D schematically illustrate an operation of the display device manufacturing method. In the following descriptions of display device manufacturing methods according to an embodiment with reference to FIG. 9A to 11D, duplicate description made with reference to FIGS. 1 to 8 will be omitted for ease in explanation of these figures, and the descriptions will be focused on different points.

A display device manufacturing method according to an embodiment may include an operation S200 of forming a light control layer. In addition, the display device manufacturing method may include an operation S100 of forming a display panel before the operation S200 of forming of the light control layer; and an operation S300 of providing a light control layer on the display panel after the operation S200 of forming of the light control layer.

The operation S200 of forming the light control layer may include an operation S210 of forming partition walls and an operation S220 of forming a light control part. The light control layer CCL may be formed on a color filter layer CFL.

FIGS. 10A to 10E schematically illustrate a display device manufacturing method further including an operation of forming a cover layer and an operation of forming a sub cover layer. The operation of forming a cover layer may be performed before the operation of forming the light control part, and the operation of forming a sub cover layer may be performed after the operation of forming the light control part. That is, the operations of forming partition walls, forming a cover layer, forming a light control part, and forming a sub cover layer may be performed in consecutive order.

Figure 10A:
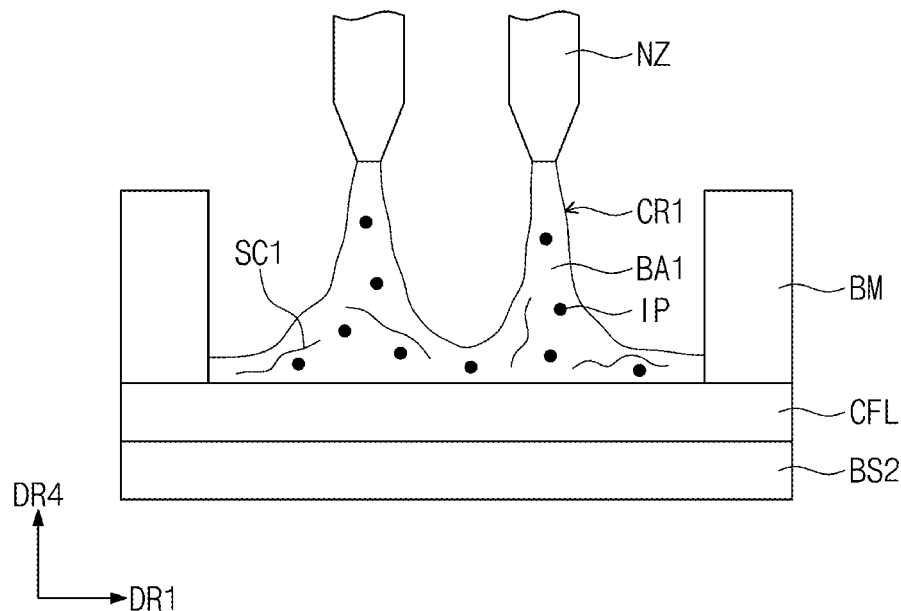
FIG. 10A schematically illustrates an operation of a display device manufacturing method according to an embodiment.

FIG. 10A illustrates that a first composition CR1 for forming a cover layer CV is provided through a nozzle NZ. However, this is illustrative as one possible implementation of a method according to an embodiment, and a method of providing a first composition CR1 is not limited thereto.

The first composition CR1 may include a first base polymer resin BA1, inorganic particles IP and a first base dispersant SC1. The first base dispersant SC1 may include at least one of an acidic substituent or a basic substituent. The chemical properties of the first base dispersant SC1 may vary depending on the acidic substituent or basic substituent included in the first base dispersant SC1. As the first base dispersant SC1 includes at least one of an acidic substituent or a basic substituent, the cover layer CV may be formed which covers side surfaces of the partition walls BM.

The inorganic particles IP of the first composition CR1 may be formed of the same material as shells of quantum dots QD-a and QD-b. Alternatively, the first composition CR1 may include, as a compound, the same material as the shells of the quantum dots QD-a and QD-b.

The first base polymer resin BA1 included in the first composition CR1 may have a vapor pressure of $10^{-3}$ mmHg or more. More specifically, the first base polymer resin BA1 included in the first composition CR1 may have a vapor pressure greater than $10^{-3}$ mmHg. The first base polymer resin BA1 having a relatively higher vapor pressure may easily volatilize when the cover layer CV is formed. For example, the first base polymer resin BA1 may include at least one of propylene glycol monomethyl ether acetate (PGMEA), cyclohexylamine (CHA), N-methyl pyrrolidone (NMP) or γ-butyrolactone (GBL). However, this is illustrative as one possible implementation of an embodiment, and a material included in the first base polymer resin BA1 is not limited thereto.

The first composition CR1 may further include a photoinitiator or a thermal initiator. In order to form the cover layer CV, light or heat may be supplied to the first composition CR1. As the first composition CR1 is cured, the cover layer CV may be formed. In addition, the first composition CR1 may further include a small amount of ligands LD. In a display device DD including the cover layer CV formed from the first composition CR1 with the small amount of ligands LD, the duration of the overshoot may be reduced. The amount of the ligands LD included in the first composition CR1 may be very small compared to the amount of ligands LD included in a quantum dot composition QR to be described later.

Figure 10B:
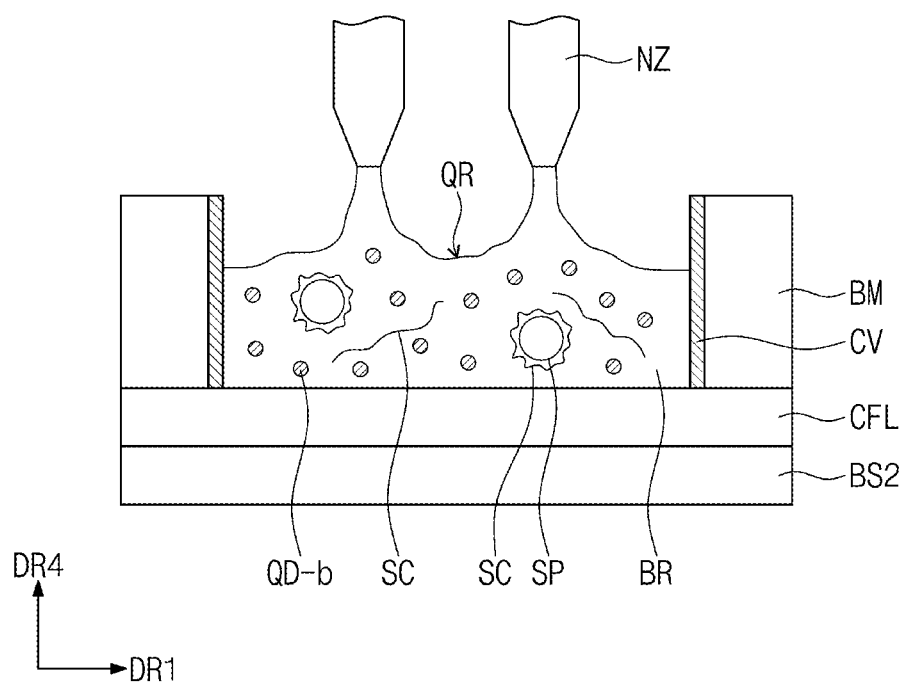
FIG. 10B schematically illustrates an operation of a display device manufacturing method according to an embodiment.

Referring to FIG. 10B, a quantum dot composition QR may be provided through a nozzle NZ between the partition walls BM after the cover layer CV is formed. However, this is illustrative as one possible implementation of a method according to an embodiment, and a method of providing a quantum dot composition QR is not limited thereto.

As described above, the light control part CL may be formed from a quantum dot composition QR. A quantum dot composition QR according to an embodiment may include a polymer resin BR, and quantum dot QD-b and scatterers SP which are dispersed in the polymer resin BR. The quantum dot composition QR may include a polymer resin having a vapor pressure of $10^{-3}$ mmHg or less. In addition, the quantum dot composition QR may include a first dispersant SC. At least one of the polymer resin BR or the first dispersant SC may include the same material as a shell SL of a second quantum dot QD-b.

Figure 10C:
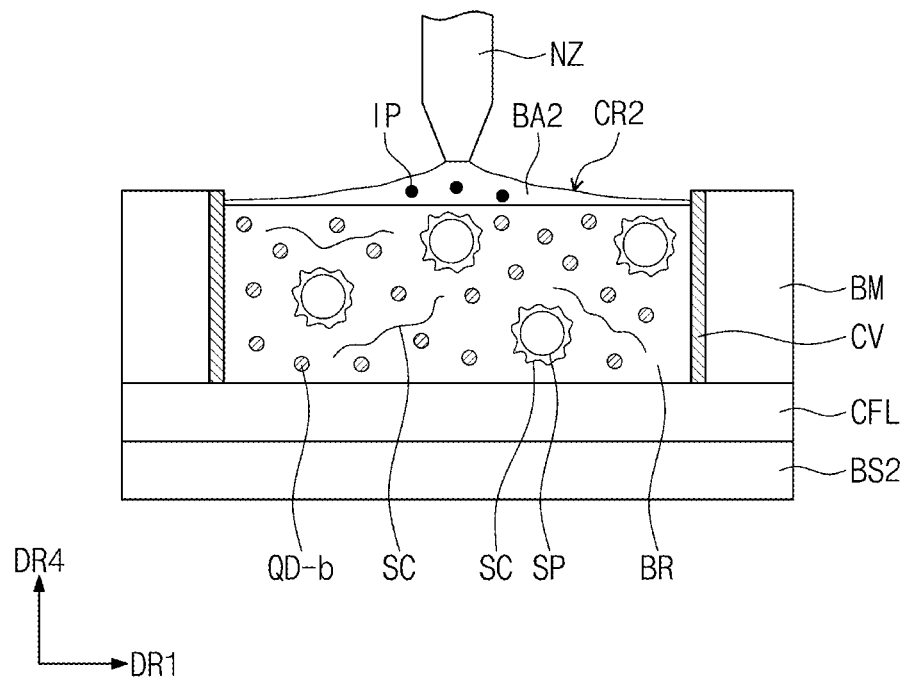
FIG. 10C schematically illustrates an operation of a display device manufacturing method according to an embodiment.

Referring to FIG. 10C, a second composition CR2 for forming a sub cover layer CV-S may be provided after the quantum dot composition QR is provided. The second composition CR2 may include a second base polymer resin BA2. The second base polymer resin BA2 may include the same material as the shell SL of the second quantum dot QD-b. The second base polymer resin BA2 may have a vapor pressure of $10^{-3}$ mmHg or less. For example, the second base polymer resin BA2 may include at least one of an acrylate-based compound, a diacrylate-based compound, or a methacrylate-based compound. In addition, the second composition CR2 may further include inorganic particles IP formed of the same material as the shell SL of the second quantum dot QD-b.

The inorganic material content of the second composition CR2 forming a sub cover layer CV-S may be similar to the inorganic material content of the quantum dot composition QR. Accordingly, the second composition CR2 and the quantum dot composition QR may be maintained in a separated state without being mixed. The second composition CR2 may be provided before curing the quantum dot composition QR, and the second composition CR2 and the quantum dot composition QR that are in the separated state may be cured in the same operation.

Figure 10D:
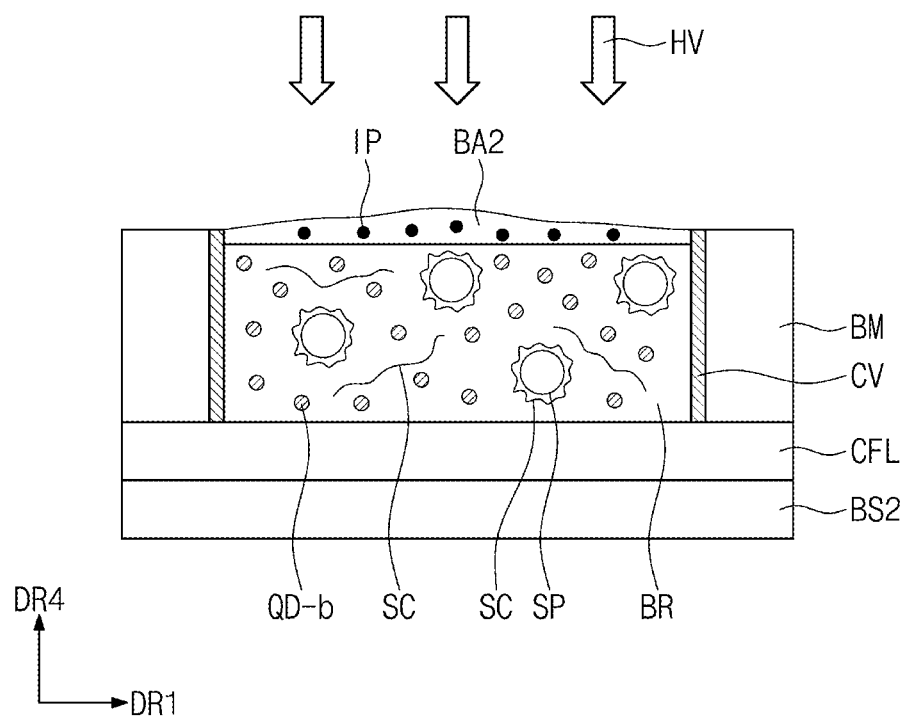
FIG. 10D schematically illustrates an operation of a display device manufacturing method according to an embodiment.

As illustrated in FIG. 10D, heat HV is supplied to the second composition CR2 and the quantum dot composition QR. Otherwise illustrated, the heat HV may be supplied together with light, or the light may be supplied without the heat.

Figure 10E:
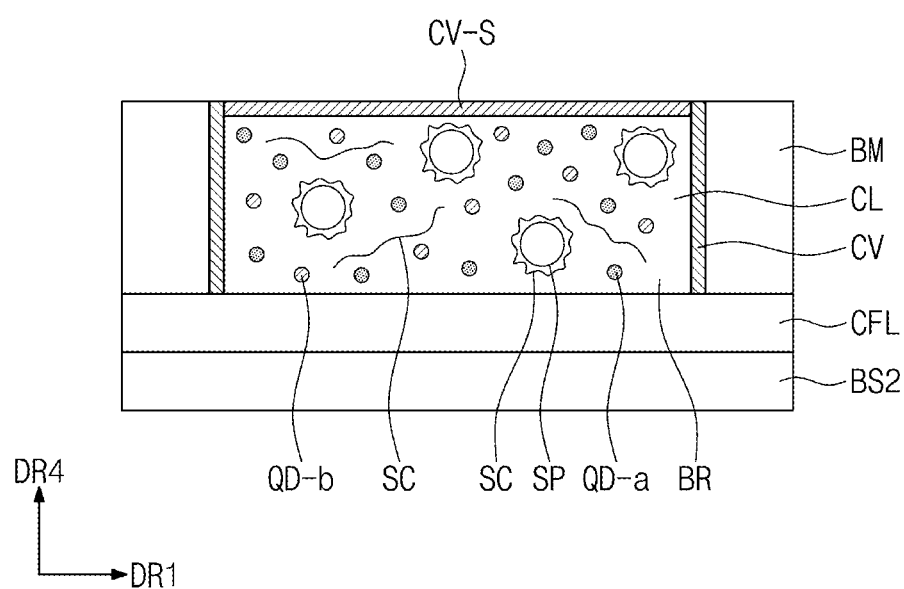
FIG. 10E schematically illustrates an operation of a display device manufacturing method according to an embodiment.

As illustrated in FIG. 10E, the light control part CL is formed from the quantum dot composition QR, and the sub cover layer CV-S is formed from the second composition CR2. The light control part CL formed from the quantum dot composition QR may include first quantum dots QD-a and second quantum dots QD-b, and the first quantum dot QD-a may be formed by detaching the ligands LD from the second quantum dots QD-b by heat. In addition, the light control part CL may include a polymer resin BR, a scatterer SP and a dispersant SC.

When the sub cover layer CV-S is not formed, at least one of heat or light may be supplied to the quantum dot composition QR after the quantum dot composition QR is provided. The ligands LD may be detached from the second quantum dots QD-b due to at least one of heat or light. At least one of the ligands LD may bind to an element including the same material as the shell SL of the second quantum dot QD-b. At least one of the ligands LD may bind to the polymer resin BR, the dispersant SC or the cover layer CV.

FIGS. 11A to 11D schematically illustrate a display device manufacturing method including an operation of forming a coating layer. In FIGS. 11A to 11D, operations of forming a light control part and forming a coating layer are illustrated in consecutive order. When the display device manufacturing method includes the operation of forming a coating layer after the operation S220 of forming a light control part, the coating layer CA may be formed on one surface of the light control part CL adjacent to the display element layer DP-ED.

Figure 11A:
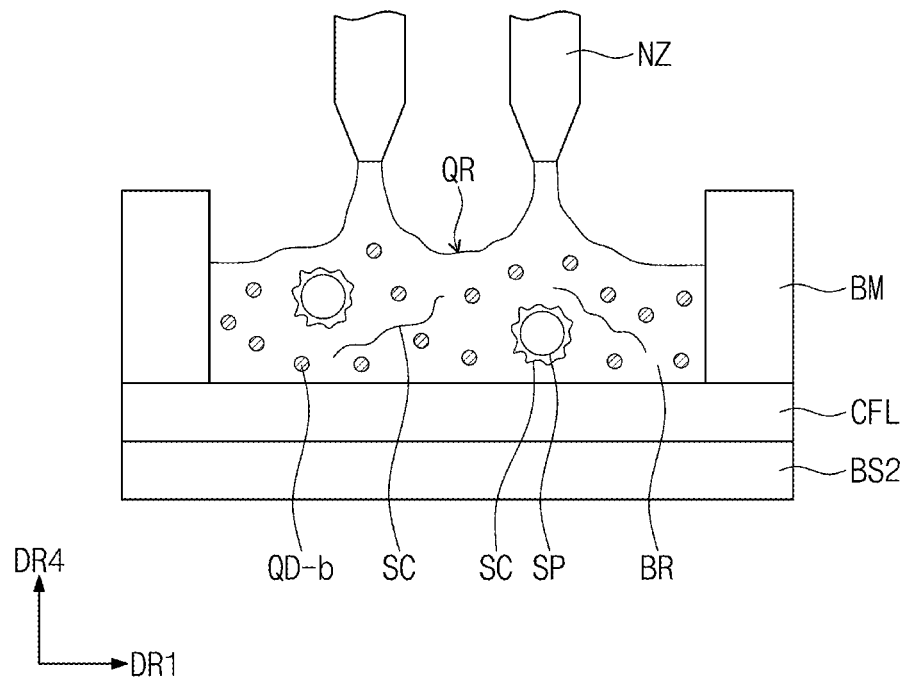
FIG. 11A schematically illustrates an operation of a display device manufacturing method according to an embodiment.

FIG. 11A illustrates that the quantum dot composition QR is provided through the nozzle NZ between the partition walls BM. As described above, the quantum dot composition QR according to an embodiment may include a polymer resin BR, and second quantum dots QD-b and scatterers SP dispersed in the polymer resin BR. The quantum dot composition QR may include the polymer resin BR having a vapor pressure of $10^{-3}$ mmHg or less. In addition, the quantum dot composition QR may include a first dispersant SC. At least one of the polymer resin BR or the first dispersant SC may include the same material as a shell SL of a second quantum dot QD-b.

Figure 11B:
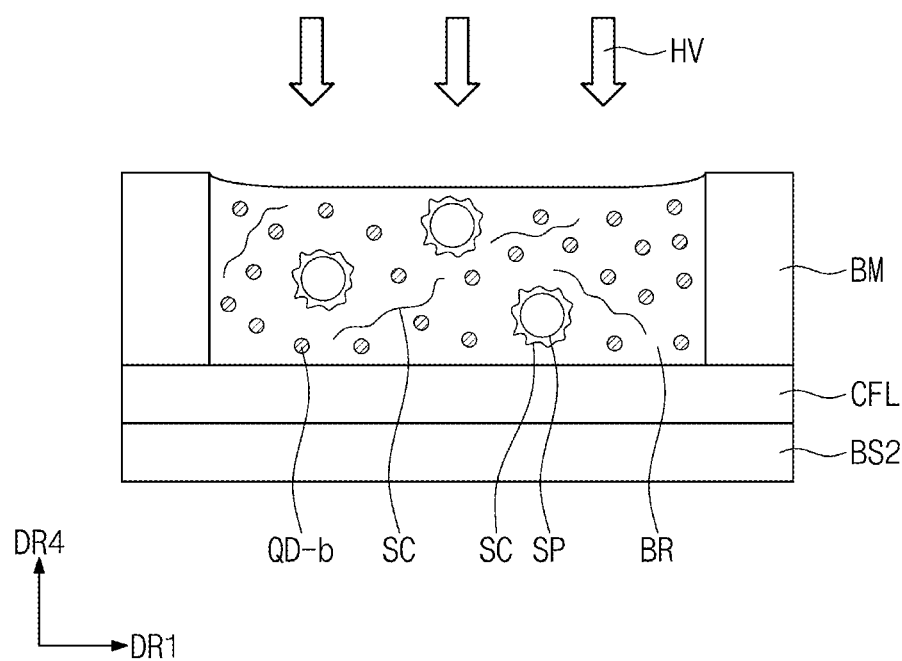
FIG. 11B schematically illustrates an operation of a display device manufacturing method according to an embodiment.

FIG. 11B illustrates that the light control part CL is formed by supplying heat HV to the quantum dot composition QR. The quantum dot composition QR may be cured by the heat HV to form the light control part CL. In addition, as the heat HV is supplied, ligands LD (see FIG. 4B) may be detached from the second quantum dots QD-b. However, this is illustrative as one possible implementation according to an embodiment, and both heat HV and light may be supplied to the quantum dot composition QR, or the light may be supplied without the heat.

Figure 11C:
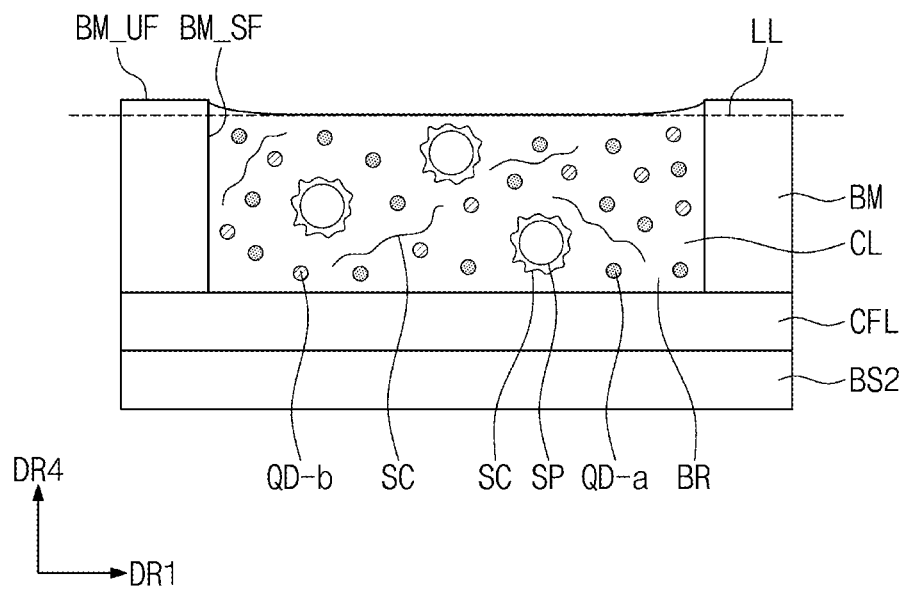
FIG. 11C schematically illustrates an operation of a display device manufacturing method according to an embodiment.

Referring to FIG. 11C, on the basis of a fourth direction axis DR4, the light control part CL may not be formed to be the same height as the partition walls BM. The side surfaces BM-SF of the partition walls BM may exhibit hydrophilicity, and the surfaces BM-UF of the partition walls BM may exhibit hydrophobicity. Due to such difference in physical property, the quantum dot composition QR may not be filled to be flush with the partition walls BM. On the basis of the fourth direction axis DR4, the quantum dot composition QR may be filled to be lower than the height of the partition walls BM, and the light control part CL formed from the quantum dot composition QR may have a smaller height than the heights of the partition walls BM.

Accordingly, the surfaces BM-UF of the partition walls BM may be removed through a physical process to be flush with the light control part CL. For example, the surfaces BM-UF of the partition walls BM may be removed through a polishing process. The surfaces BM-UF of the partition walls BM may be removed along a first line LL. On the basis of the fourth direction axis DR4, the first line LL may be on the same plane as one surface of the light control part CL. The one surface of the light control part CL may be spaced from a color filter layer CFL and adjacent to a display element layer DP-ED.

Figure 11D:
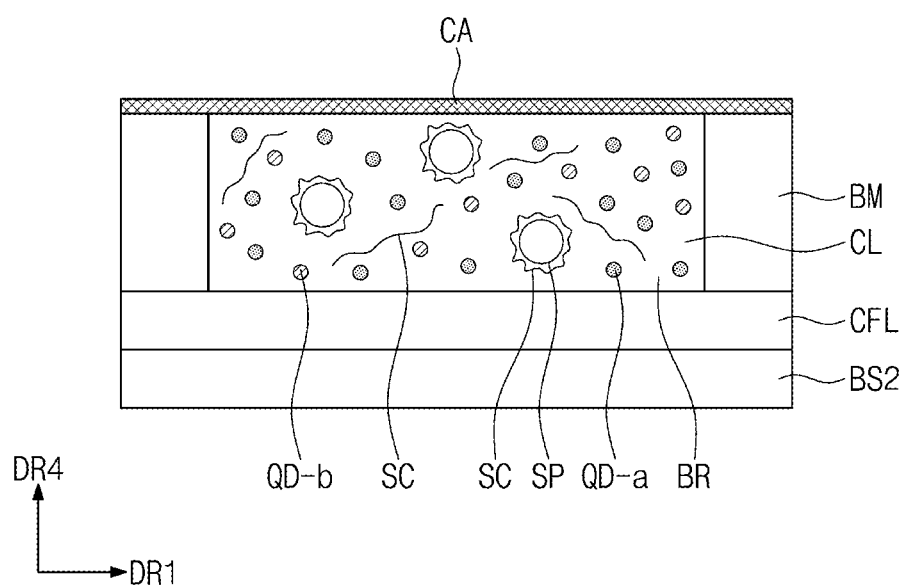
FIG. 11D schematically illustrates an operation of a display device manufacturing method according to an embodiment.

Referring to FIG. 11D, a coating layer CA may be formed on the partition walls BM and the light control part CL. After a physical process such as a polishing process is performed, the coating layer CA may be formed by coating the entire surface of the light control layer CCL. For examples, a composition provided for forming the coating layer CA may be in a form of a photoresist or ink. The composition provided for forming the coating layer CA may include the same material as the shell SL of the quantum dot QD-b. The composition provided for forming the coating layer CA may include at least one of the scatterer SP or the polymer resin BR of the quantum dot composition QR (see FIGS. 10B and 11A). Accordingly, at least one of ligands LD may bind to the coating layer CA including the same material as the shell SL of the quantum dot QD-b.

The operation of forming the coating layer may be performed before the operation S220 of forming the light control part. More specifically, the operation of forming the coating layer may be performed before the operation S200 of forming the light control layer. Accordingly, the coating layer CA (see FIG. 7B) may be formed on another surface of the light control layer CCL adjacent to the color filter layer CFL. After the coating layer CA (see FIG. 7B) is formed on the color filter layer CFL, the light control layer CCL may be formed. When the operation of forming the coating layer is performed before the operation S200 of forming the light control layer, the polishing process may be omitted in some implementations of the embodiment described herein.

A display device manufacturing method according to an embodiment may include an operation S220 of forming a light control part, and the operation of forming the coating layer may include an operation S210 of forming partition walls and an operation S220 of forming a light control part. In the operation of forming the light control part, a quantum dot composition QR may be provided; and the quantum dot composition QR may include a second quantum dot QD-b to which a ligand LD binds, a polymer resin BR, a scatterer SP, and a dispersant SC. At least one of the polymer resin BR, the polymer resin BR, or the partition walls BM may include the same material as shells SL of quantum dots QD-a and QD-b. Accordingly, at least one of ligands LD may bind to the polymer resin BR, dispersant SC or partition walls BM including the same material as the shells SL of the quantum dots QD-a and QD-b.

In addition, a display device manufacturing method according to an embodiment may include an operation of forming a cover layer or an operation of forming a coating layer. The cover layer CV and the coating layer CA may be formed from compositions CR1 and CR2 including the same material as shells SL of quantum dots QD-a and QD-b. The cover layer CV and the coating layer CA may be formed adjacent to a light control part CL. Accordingly, at least one of ligands LD may bind to the cover layer CV and coating layer CA including the same material as the shells SL of the quantum dots QD-a and QD-b. Therefore, a display device DD manufactured by the display device manufacturing method according to an embodiment may exhibit stabilized efficiency.

Figure 12:
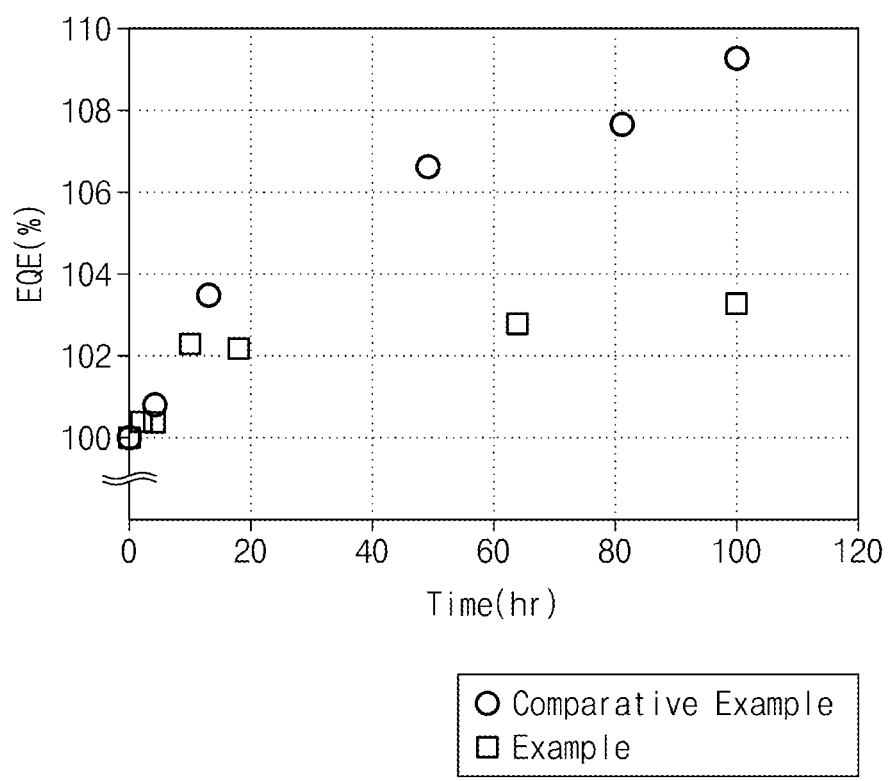
FIG. 12 is a graph showing changes in light emission efficiency over time.

FIG. 12 is a graph showing external quantum efficiency (EQE) over time in a display device of a Comparative Example and a display device of an Example constructed according to an embodiment. Table 1 more specifically indicates the values of the Comparative Example shown in the graph of FIG. 12. Table 2 more specifically indicates the values of the Example constructed according to an embodiment shown in the graph of FIG. 12.

The display device according to the Comparative Example does not have an element including the same material as a shell of a quantum dot. A device according to the Example is a display device constructed according to an embodiment and includes inorganic particles in a light control part. The inorganic particles include the same material as the shell of the quantum dot.

TABLE 1

|  | Time (hr) | | | | | |
| --- | --- | --- | --- | --- | --- | --- |
|  | 0 | 4 | 13 | 49 | 82 | 100 |
| Efficiency (EQE, %) | 100 | 100.8 | 103.4 | 106.6 | 107.6 | 109.2 |

TABLE 2

|  | Time (hr) | | | | | |
| --- | --- | --- | --- | --- | --- | --- |
|  | 0 | 2 | 4 | 11 | 18 | 64 | 100 |
| Efficiency (EQE, %) | 100 | 100.4 | 100.5 | 102.3 | 102.1 | 102.6 | 103.3 |

Referring to FIG. 12 and Table 1, it may be seen that the efficiency of the display device according to the Comparative Example was significantly increased over time. That is, it may be confirmed that the display device according to the Comparative Example exhibited the overshoot. Referring to FIG. 12 and Table 2, it may be confirmed that changes in efficiency of the display device according to Example were not significant and the efficiency was stabilized. It is thought that in the display device according to the Example, ligands bound to the inorganic particles including the same material as the quantum dot and consequently, the efficiency was stabilized. In an embodiment, therefore, a display device including an element formed of the same material as a shell of a quantum dot may exhibit stabilized efficiency.

A quantum dot composition according to an embodiment may include a scatterer, a quantum dot, a dispersant and a polymer resin. The quantum dot may include a core and a shell surrounding the core, and a ligand may bind to the shell. The dispersant and the polymer resin may each include the same material as the shell of the quantum dot, and at least one of ligands may bind thereto. Accordingly, a display device formed by using the quantum dot composition according to an embodiment may exhibit stabilized efficiency.

A display device manufacturing method according to an embodiment may include an operation of forming a light control layer, and the operation of forming a light control layer may include an operation of forming partition walls and an operation of forming a light control part. In the operation of forming the light control part, a quantum dot composition according to an embodiment may be provided. Accordingly, a display device formed by the display device manufacturing method according to an embodiment may prevent the overshoot.

In addition, a display device according to an embodiment may include a display element layer, a color filter layer disposed on the display element layer, and a light control layer disposed between the color filter layer and the display element layer. The light control layer may include partition walls and a light control part, and the light control part may be formed from a quantum dot composition according to an embodiment. The light control part may include a plurality of ligands that bind to a shell of a quantum dot or are detached from the shell of the quantum dot. At least one of the ligands may bind to a polymer resin, dispersant, or partition walls including the same material as the shell of the quantum dot. Accordingly, the display device according to an embodiment may exhibit stabilized efficiency.

A quantum dot composition according to an embodiment may include at least one element including the same material as a shell of a quantum dot, and thus, a ligand on a surface of the quantum dot is detached and binds to the at least one element. Accordingly, the light efficiency may be increased.

A display device manufacturing method according to an embodiment may include providing a quantum dot composition and thus, a display device manufactured by the display device manufacturing method may exhibit stabilized efficiency.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A quantum dot composition comprising:
a scatterer that includes an inorganic material;
a quantum dot that includes a core and a shell surrounding the core;
a ligand binding to the quantum dot;
a polymer resin in which the quantum dot and the scatterer are dispersed; and
a dispersant that includes at least one of an acidic substituent or a basic substituent,
wherein at least one of the polymer resin or the dispersant comprises a same material as the shell.

2. The quantum dot composition of claim 1, wherein
the dispersant comprises the same material as the shell; and
the ligand is detached from the quantum dot due to at least one of heat or light to bind to the dispersant.

3. The quantum dot composition of claim 1, wherein
the polymer resin comprises the same material as the shell; and
the ligand is detached from the quantum dot due to at least one of heat or light to bind to the polymer resin.

4. The quantum dot composition of claim 1, further comprising an inorganic particle that includes the same material as the shell and dispersed in the polymer resin,
wherein the ligand is detached from the quantum dot due to at least one of heat or light to bind to the inorganic particle.

5. The quantum dot composition of claim 4, further comprising a sub dispersant configured to disperse the inorganic particle.

6. The quantum dot composition of claim 1, wherein the polymer resin comprises an acrylate-based compound, a diacrylate-based compound, or a methacrylate-based compound.

7. The quantum dot composition of claim 1, wherein the polymer resin has a vapor pressure of $10^{-3}$ mmHg or less.

8. The quantum dot composition of claim 1, wherein the shell comprises at least one of $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, $NiO$, $MgAl_2O_4$, $CoFe_2O_4$, $NiFe_2O_4$, $CoMn_2O_4$, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb.

9. A display device manufacturing method comprising forming a light control layer,
the forming of the light control layer including:
forming a plurality of partition walls spaced apart from each other; and
forming a light control part by providing a quantum dot composition between the partition walls,
wherein the quantum dot composition includes:
a scatterer that includes an inorganic material,
a quantum dot that includes a core and a shell surrounding the core,
a ligand binding to the quantum dot,
a polymer resin in which the quantum dot and the scatterer are dispersed, and
a dispersant that includes at least one of an acidic substituent or a basic substituent,
wherein at least one of the polymer resin, the dispersant, or the partition walls comprises a same material as the shell.

10. The method of claim 9, wherein
the forming of the light control part comprises supplying at least one of heat or light to the quantum dot composition; and
the ligand is detached from the quantum dot due to at least one of the heat or the light to bind to at least one of the polymer resin, the dispersant, or the partition walls.

11. The method of claim 9, further comprising, before the forming of the light control part, forming a cover layer that comprises the same material as the shell and covers side surfaces of the partition walls.

12. The method of claim 9, further comprising, before or after the forming of the light control layer, forming a coating layer that comprises the same material as the shell and is disposed on one surface of the light control layer.

13. The method of claim 12, further comprising, before the forming of the coating layer, polishing the one surface of the light control layer.

14. A display device comprising:
a display element layer;
a color filter layer disposed on the display element layer; and
a light control layer disposed between the display element layer and the color filter layer,
the light control layer including:
a plurality of partition walls spaced apart from each other, and
a light control part disposed between the partition walls,
the light control part including:
a quantum dot containing a core and a shell surrounding the core,
a scatterer containing an inorganic material,
a polymer resin in which the quantum dot and the scatterer are dispersed,
a dispersant containing at least one of an acidic substituent or a basic substituent, and
a plurality of ligands binding to the surface of the shell or detached from the surface of the shell,
wherein at least one of the polymer resin, the dispersant, or the partition walls comprises a same material as the shell, and
at least one of the ligands binds to the polymer resin, dispersant, or partition walls including the same material as the shell.

15. The display device of claim 14, wherein
the light control part further comprises an inorganic particle that includes the same material as the shell and dispersed in the polymer resin; and
at least one of the ligands binds to the inorganic particle.

16. The display device of claim 14, wherein
the light control layer further comprises a cover layer that includes the same material as the shell and covers side surfaces of the partition walls adjacent to the light control parts; and
at least one of the ligands binds to the cover layer.

17. The display device of claim 16, wherein
the light control layer further comprises a sub cover layer that includes the same material as the shell and covers one surface of the light control parts adjacent to the display element layer; and
at least one of the ligands binds to the sub cover layer.

18. The display device of claim 17, wherein the sub cover layer does not overlap the partition walls.

19. The display device of claim 14, further comprising a coating layer that includes the same material as the shell and is disposed on an upper surface or a lower surface of the light control layer,
wherein at least one of the ligands binds to the coating layer.

20. The display device of claim 14, wherein
the partition walls comprise an inorganic particle formed of the same material as the shell, or the partition walls comprise a compound formed of the same material as the shell; and
at least one of the ligands binds to the inorganic particle or the compound.

* * * * *